United States Patent
Oota et al.

(10) Patent No.: US 11,189,652 B2
(45) Date of Patent: Nov. 30, 2021

(54) STRUCTURE, COLOR FILTER, SOLID-STATE IMAGING ELEMENT, IMAGE DISPLAY DEVICE, METHOD FOR PRODUCING STRUCTURE, AND COMPOSITION FOR FORMING ORGANIC MATERIAL LAYER

(71) Applicant: FUJIFILM Corporation, Tokyo (JP)

(72) Inventors: Kazuya Oota, Haibara-gun (JP); Kaoru Aoyagi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 134 days.

(21) Appl. No.: 16/366,402

(22) Filed: Mar. 27, 2019

(65) Prior Publication Data

US 2019/0221596 A1  Jul. 18, 2019

Related U.S. Application Data

(63) Continuation of application No. PCT/JP2017/034646, filed on Sep. 26, 2017.

(30) Foreign Application Priority Data

Sep. 30, 2016 (JP) .............................. JP2016-192564

(51) Int. Cl.
    *H01L 27/146* (2006.01)
    *H04N 5/374* (2011.01)
    (Continued)

(52) U.S. Cl.
    CPC ........ *H01L 27/14621* (2013.01); *G02B 5/201* (2013.01); *G09F 9/00* (2013.01); *H04N 5/374* (2013.01); *H01L 27/14685* (2013.01)

(58) Field of Classification Search
    None
    See application file for complete search history.

(56) References Cited

U.S. PATENT DOCUMENTS 5,404,005 A * 4/1995 Shimomura ...... H01L 27/14621
                                               250/208.1
2006/0115749 A1* 6/2006 Toyoda .................. G02B 5/201
                                                       430/7
(Continued)

FOREIGN PATENT DOCUMENTS

CN   1782812 A   6/2006
CN   103261968 A   8/2013
(Continued)

OTHER PUBLICATIONS

Office Action dated Sep. 16, 2020 from the State Intellectual Property Office of the P.R.C. in Machine Chinese application No. 201780058917.9.
(Continued)

*Primary Examiner* — Evren Seven
(74) *Attorney, Agent, or Firm* — Sughrue Mion, PLLC

(57) ABSTRACT

Provided are a structure having excellent moisture resistance, a color filter, a solid-state imaging element, an image display device, and a method for producing a structure. Provided is also a composition for forming an organic material layer which is used to form the above-mentioned structure. This structure 100 has a support 1, partition walls 2 formed on the support 1, colored layers 4 formed in regions partitioned by the partition walls 2, on the support 1, and organic material layers 3 formed using a composition including a compound having a group with an ethylenically unsaturated bond, between the partition walls 2 and the colored layers 4.

21 Claims, 1 Drawing Sheet

(51) Int. Cl.
  *G09F 9/00* (2006.01)
  *G02B 5/20* (2006.01)

(56) References Cited

U.S. PATENT DOCUMENTS

| | | | | |
|---|---|---|---|---|
| 2011/0143282 A1* | 6/2011 | Takahashi | ........... | H01L 27/3246 430/287.1 |
| 2012/0267745 A1* | 10/2012 | Tsuji | ................. | H01L 27/14627 257/432 |
| 2014/0168805 A1* | 6/2014 | Sugishima | ........... | G02B 3/0006 359/891 |
| 2016/0370646 A1* | 12/2016 | Nishiyama | ............... | G03F 7/105 |
| 2018/0301491 A1* | 10/2018 | Nakamoto | .......... | H01L 27/1463 |
| 2019/0348453 A1* | 11/2019 | Lee | ................... | H01L 27/14645 |
| 2020/0258928 A1* | 8/2020 | Seo | ................... | H01L 27/14623 |

FOREIGN PATENT DOCUMENTS

| | | |
|---|---|---|
| JP | 10-268123 A | 10/1998 |
| JP | 11-231116 A | 8/1999 |
| JP | 2003064236 A | 3/2003 |
| JP | 2007-140214 A | 6/2007 |
| JP | 2011-039404 A | 2/2011 |
| JP | 2012-227478 A | 11/2012 |
| JP | 2013-254093 A | 12/2013 |
| WO | 2010001976 A1 | 1/2010 |
| WO | 2014/203794 A1 | 12/2014 |

OTHER PUBLICATIONS

Office Action dated Apr. 23, 2020, from the Korean Intellectual Property Office in Korean application No. 10-2019-7007759.
Office Action dated Mar. 3, 2020 from the Japanese Patent Office in Japanese application No. 2018-542572.
International Search Report dated Dec. 26, 2017 from the International Searching Authority in counterpart International Application No. PCT/JP2017/034646.
International Preliminary Report on Patentability dated Apr. 2, 2019 from the International Bureau in counterpart International Application No. PCT/JP2017/034646.
Written Opinion dated Dec. 26, 2017 from the International Bureau in counterpart International Application No. PCT/JP2017/034646.
Office Action dated Sep. 1, 2020 from the Japanese Patent Office in JP Application No. 2018-542572.
Office Action dated Jan. 12, 2021, issued by the Taiwanese Intellectual Property Office in counterpart Taiwanese Application No. 106133169.
Office Action dated Feb. 23, 2021, issued by the State Intellectual Property Office of the P.R.C. in Chinese application No. 201780058917.9.
Communication dated Jun. 23, 2021, issued by the Taiwanese Patent Office in Taiwanese application No. 106133163.

* cited by examiner

STRUCTURE, COLOR FILTER, SOLID-STATE IMAGING ELEMENT, IMAGE DISPLAY DEVICE, METHOD FOR PRODUCING STRUCTURE, AND COMPOSITION FOR FORMING ORGANIC MATERIAL LAYER

CROSS-REFERENCE TO RELATED APPLICATIONS

This application is a Continuation of PCT International Application No. PCT/JP2017/034646 filed on Sep. 26, 2017, which claims priority under 35 U.S.C § 119(a) to Japanese Patent Application No. 2016-192564 filed on Sep. 30, 2016. Each of the above application(s) is hereby expressly incorporated by reference, in its entirety, into the present application.

BACKGROUND OF THE INVENTION

1. Field of the Invention

The present invention relates to a structure, a color filter, a solid-state imaging element, an image display device, a method for producing a structure, and a composition for forming an organic material layer.

2. Description of the Related Art

In recent years, as a usage of a digital camera, a mobile phone with a camera, and the like has been further spreading, there has been an increasing demand for a solid-state imaging element such as a charge coupled device (CCD) image sensor. A color filter has been used as a key device in a display or an optical element.

In one aspect of the solid-state imaging element, for example, a solid-state imaging element comprising a structure where a colored layer is embedded in the region partitioned by partition walls on a support is known.

Furthermore, in JP2012-227478A, it is described that a solid-state imaging element comprising such a structure is provided with an adhesive layer between partition walls and colored layers, using an epoxy resin or 1,1,1,3,3,3-hexamethyldisilazane.

SUMMARY OF THE INVENTION

The present inventors have conducted studies on a solid-state imaging element comprising a structure where colored layers are embedded in the regions partitioned by partition walls on a support, and as a result, they have found that in a case where a solid-state imaging element comprising such a structure is exposed to an environment having high humidity, voids are easily generated between the colored layers and the partition walls. In a case where the voids are generated between the colored layers and the partition walls, the sensitivity of the device is changed, and it is thus preferable to suppress the generation of the voids.

Furthermore, according to the studies conducted by the present inventors, it was found that even in a case where adhesive layers are formed using an epoxy resin, or 1,1,1,3,3,3-hexamethyldisilazane between partition walls and colored layers, voids are easily generated between the colored layers and the partition walls, as described in JP2012-227478A.

Therefore, an object of the present invention is to provide a structure having excellent moisture resistance, a color filter, a solid-state imaging element, an image display device, and a method for producing a structure. Another object of the present invention is to provide a composition for forming an organic material layer, which is used for formation of the above-mentioned structure.

As a result of extensive studies conducted by the present inventors, it was found that in a structure including a support, partition walls formed on the support, and colored layers formed in the regions partitioned by the partition walls, on the support, voids are hardly generated between the colored layers and the partition walls even in a case where the structure is exposed to an environment having high humidity, by providing organic material layers formed using a composition including a compound having a group with an ethylenically unsaturated bond between the partition walls and the colored layers, thereby completing the present invention. That is, the present invention is as follows.

<1> A structure comprising:
a support;
partition walls formed on the support;
colored layers formed in regions partitioned by the partition walls, on the support; and
organic material layers formed using a composition including a compound having a group with an ethylenically unsaturated bond, between the partition walls and the colored layers.

<2> The structure as described in <1>,
in which a thickness of the organic material layer is 30 nm or less.

<3> The structure as described in <1> or <2>,
in which the compound having a group with an ethylenically unsaturated bond includes a resin having a group with an ethylenically unsaturated bond in a side chain thereof.

<4> The structure as described in <3>,
in which an acid value of the resin is 10 to 100 mgKOH/g.

<5> The structure as described in <3> or <4>,
in which a weight-average molecular weight of the resin is 5,000 to 20,000.

<6> The structure as described in any one of <1> to <5>,
in which the composition further includes a surfactant.

<7> The structure as described in any one of <1> to <6>,
in which the colored layers are formed using a composition including a compound having a group with an ethylenically unsaturated bond.

<8> A color filter comprising the structure as described in any one of <1> to <7>.

<9> A solid-state imaging element comprising the structure as described in any one of <1> to <7>.

<10> An image display device comprising the structure as described in any one of <1> to <7>.

<11> A method for producing a structure, comprising:
a step of forming partition walls on a support;
a step of forming organic material layers using a composition for forming an organic material layer, including a compound having a group with an ethylenically unsaturated bond, on the surface of the partition walls; and
a step of forming colored layers in regions partitioned by the partition walls having the organic material layers formed on the surface thereof, on the support.

<12> The method for producing a structure as described in <11>,
in which the compound having a group with an ethylenically unsaturated bond includes a resin having a group with an ethylenically unsaturated bond in a side chain thereof.

<13> The method for producing a structure as described in <11> or <12>, in which the composition for forming an organic material layer further includes a surfactant.

<14> The method for producing a structure as described in any one of <11> to <13>, in which the composition for forming an organic material layer contains 99% to 99.99% by mass of a solvent.

<15> The method for producing a structure as described in any one of <11> to <14>, in which the colored layers are formed using a coloring composition including a compound having a group with an ethylenically unsaturated bond.

<16> A composition for forming an organic material layer of a structure including a support, partition walls formed on the support, colored layers formed in regions partitioned by the partition walls, on the support, and the organic material layers formed between the partition walls and the colored layers, the composition comprising a compound having a group with an ethylenically unsaturated bond.

<17> The composition for forming an organic material layer as described in <16>, in which the compound having a group with an ethylenically unsaturated bond includes a resin having a group with an ethylenically unsaturated bond in a side chain thereof.

<18> The composition for forming an organic material layer as described in <16> or <17>, further comprising a surfactant.

<19> The composition for forming an organic material layer as described in any one of <16> to <18>, further comprising 99% to 99.99% by mass of a solvent.

According to the present invention, it is possible to provide a structure having excellent moisture resistance, a color filter, a solid-state imaging element, an image display device, and a method for producing a structure. It is also possible to provide a composition for forming an organic material layer, which is used to form the above-mentioned structure.

DESCRIPTION OF THE PREFERRED EMBODIMENTS

Hereinafter, the contents of the present invention will be described in detail.

In citations for a group (atomic group) in the present specification, in a case where the group (atomic group) is denoted without specifying whether it is substituted or unsubstituted, the group (atomic group) includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also writing using particle rays such as electron beams and ion beams. Further, examples of light for use in exposure generally include actinic rays or radiation such as a bright line spectrum of a mercury lamp, far ultraviolet rays typified by an excimer laser, extreme ultraviolet rays (EUV rays), X-rays, and electron beams.

In the present specification, a numerical range expressed using "to" means a range that includes the preceding and succeeding numerical values of "to" as the lower limit value and the upper limit value, respectively.

In the present specification, the total solid content refers to a total mass of the components remaining in a case where a solvent is excluded from all the components of a composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, a term "step" includes not only an independent step, but also a step which is not clearly distinguished from other steps in a case where an intended action of the step is accomplished.

In the present specification, a weight-average molecular weight (Mw) and a number-average molecular weight (Mn) are defined as values in terms of polystyrene by gel permeation chromatography (GPC).

<Structure>

Figure 1:
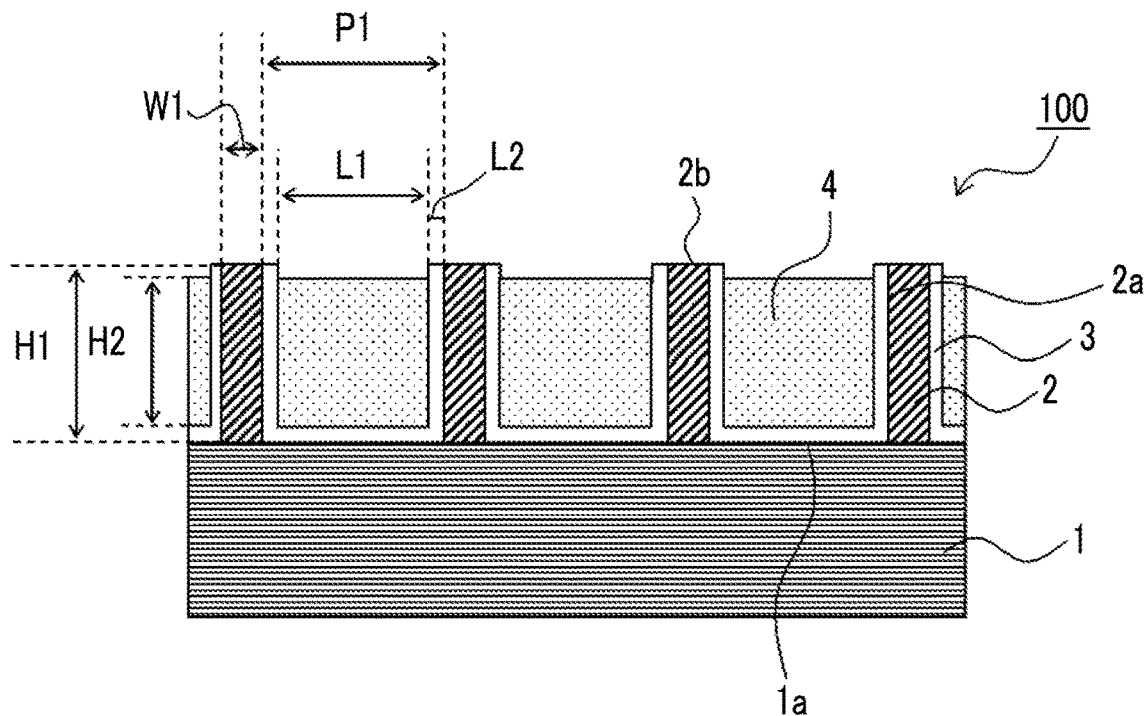
FIG. 1 is a side sectional view showing an embodiment of the structure of the present invention.
Figure 2:
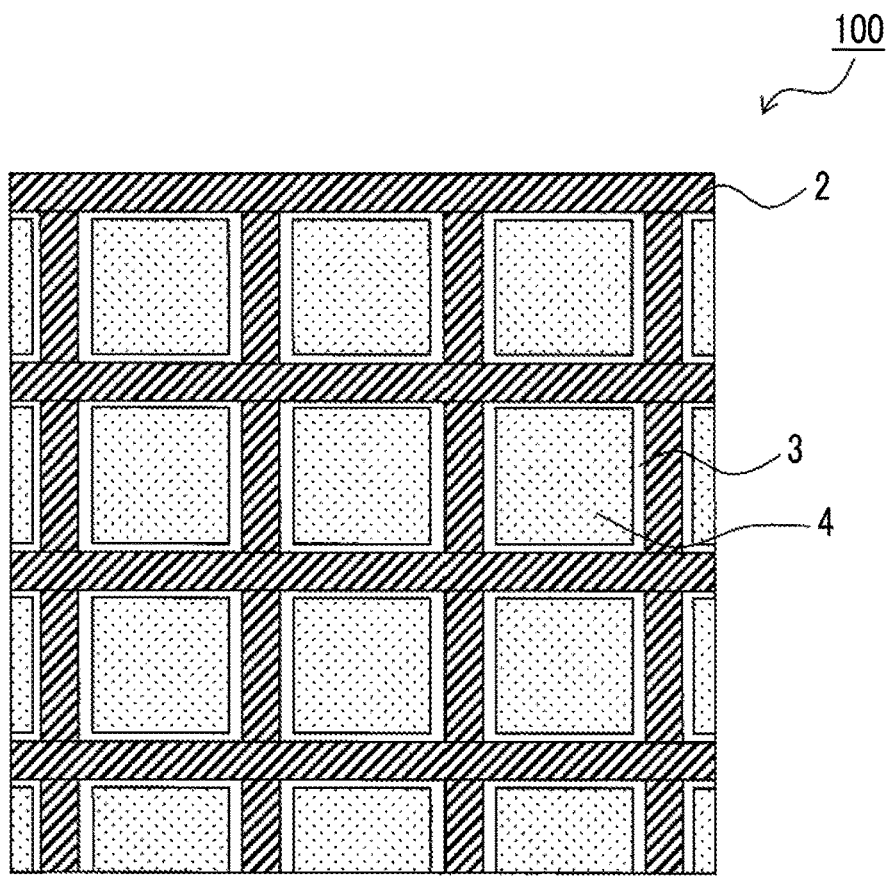
FIG. 2 is a plan view viewed from directly above a support in the same structure.

The structure of the embodiment of the present invention will be described with reference to drawings. FIG. 1 is a side sectional view showing an embodiment of the structure of the present invention. FIG. 2 is a plan view viewed from directly above a support in the same structure.

As shown in FIGS. 1 and 2, a structure 100 of the embodiment of the present invention includes a support 1, partition walls 2 formed on the support 1, colored layers 4 formed in regions partitioned by the partition walls 2, on the support 1, and organic material layers 3 formed using a composition including a compound having a group with an ethylenically unsaturated bond, between the partition walls 2 and the colored layers 4.

By the structure of the embodiment of the present invention, voids are hardly generated between the colored layers and the partition walls even in a case where the structure is exposed to an environment having high humidity, and thus, the moisture resistance is excellent. A reason for achieving such an effect is thought to be that the organic material layers formed using a composition including a compound having a group with an ethylenically unsaturated bond have appropriately low hygroscopicity as well as excellent compatibility, adhesiveness, and the like with the colored layers, and thus, excellent moisture resistance is obtained. Meanwhile, in the organic material layers formed using an epoxy resin as in JP2012-227478A instead of the compound having a group with an ethylenically unsaturated bond, the moisture resistance is deteriorated as described in Examples which will be described later. A reason therefor is thought to be that since the hygroscopicity of the epoxy resin itself is high, the adhesiveness between the organic material layers and the colored layers, the adhesiveness between the organic material layers and the partition walls, and the like are lowered in a case where such a structure is exposed to an environment having high humidity, and as a result, voids are easily generated between the colored layers and the partition walls. Further, even in a case where adhesive layers (also referred to as HMDS layers) are formed using 1,1,1,3,3,3-hexamethyldisilazane as in JP2012-227478A, instead of the organic material layers, the moisture resistance is deteriorated as shown in Examples which will be described later. A reason therefor is thought to be that since the HMDS layers themselves have high hydrophobicity, the adhesiveness between the HMDS layers and the colored layers is lowered in a case where such a structure is exposed to an environment having high humidity, and as a result, voids are easily generated between the colored layers and the partition walls.

In the structure of the embodiment of the present invention, in a case where the colored layers are formed using a composition including a compound having a group with an ethylenically unsaturated bond, the compatibility and the adhesiveness between the colored layers and the organic material layers can be more enhanced, and in particular, excellent moisture resistance is easily obtained.

The structure of the embodiment of the present invention can be preferably used in a color filter, a solid-state imaging element, an image display device, or the like. More specifically, it can be preferably used an imaging device that is mounted on a digital still camera, a digital video camera, a surveillance camera, an on-vehicle camera, or the like. Hereinafter, the structure of the embodiment of the present invention will be described in detail.

In the structure of the embodiment of the present invention, the support 1 is not particularly limited. A substrate (a silicon wafer, a silicon carbide wafer, a silicon nitride wafer, a sapphire wafer, a glass wafer, and the like) that is used in various electronic devices such as a solid-state imaging element can be used. Incidentally, a substrate for a solid-state imaging element having a photodiode formed thereon can also be used. In addition, an undercoat layer may be provided on the substrate so as to improve adhesion to an upper layer, prevent the diffusion of materials, or flatten the surface.

The partition walls 2 are formed on the support 1. In this embodiment, the partition walls 2 are formed in a lattice shape in a plan view viewed from directly above the support 1 as shown in FIG. 2. Further, in this embodiment, the shape of the region partitioned by the partition walls 2 on the support 1 (hereinafter also referred to as the shape of the opening of the partition walls) is formed into a square shape, but the shape of the opening of the partition walls is not particularly limited, and may be, for example, a rectangular shape, a circular shape, an elliptical shape, a polygonal shape, or the like.

The material of the partition walls 2 is not particularly limited, but it is preferably formed of a material having a small refractive index than that of the colored layers 4. According to this aspect, a structure where the colored layers 4 having a high refractive index are surrounded by the partition walls 2 having a small refractive index can be used. In this manner, the light leaking from the colored layers 4 having a high refractive index is easily reflected by the partition walls 2 and returns to the colored layers 4, whereby it is possible to suppress the leakage of light to the adjacent colored layers 4. As specific examples of the material of the partition walls 2, various inorganic materials or organic materials can be used. For example, examples of the organic materials include an acrylic resin, a polystyrene-based resin, a polyimide-based resin, an organic spin-on-glass (SOG)-based resin, a siloxane resin, and a fluorine resin. Examples of the inorganic materials include porous silica, polycrystalline silicon, colloidal silica particles, silicon oxide, silicon nitride, and metal materials such as tungsten and aluminum. Since good moisture resistance can be obtained even in a case where the partition walls 2 are formed of an inorganic material, the laminate of the embodiment of the present invention is particularly effective in a case where the partition walls 2 are formed of the inorganic material. In addition, for a reason that the workability of the partition walls is good, a deviation in width dimensions, defects, or the like is small, and partition walls having a low refractive index are easily formed, it is preferable that the partition walls include a siloxane resin.

Examples of the siloxane resin include a resin obtained by a hydrolysis reaction and a condensation reaction, using an alkoxysilane raw material. The siloxane resin may be a siloxane resin which has a silsesquioxane structure of any of a cage type, a ladder type, a random type, and the like. Further, with regard to the "cage type", the "ladder type", and the "random type", reference can be made to, for example, the structures which are described in "Chemistry and Application Development of Silsesquioxane Material (CMC Publishing)" or the like.

The siloxane resin preferably has a silsesquioxane structure represented by Formula (1).

$$—(R^1SiO_{3/2})_n—$$  Formula (S1)

(In Formula (S1), $R^1$ represents an alkyl group having 1 to 3 carbon atoms and n represents an integer of 20 to 1,000.)

The alkyl group represented by $R^1$ may have a substituent. Examples of the substituent include a fluorine atom, an amino group, a sulfonamido group, an acyloxy group, a carbamoyl group, and an acylamino group.

It is also preferable that the siloxane resin is a cage type siloxane resin. Since the cage type siloxane resin has voids in a molecule thereof, it can further decrease the refractive index of the partition walls. Moreover, the workability is good, the smoothness of the surface of the colored layer side can be increased, and thus, the light collection rate for the colored layers can be increased. The siloxane weight-average molecular weight of the cage type resin is preferably 50,000 to 300,000. The dispersity (weight-average molecular weight/number-average molecular weight) of the cage type siloxane resin is preferably 2 to 4, more preferably 2 to 3.5, and still more preferably 2.5 to 3.5. The cage type siloxane resin is preferably a resin having a partial structure represented by Formula (S1-1). The wavy line in the following formula is a bonding site to another atomic group constituting the cage type siloxane resin. For example, as a preferred example of the cage type siloxane resin, a resin having a structure where at least two bonding sites out of the following eight bonding sites are bonded to a linking group L that links the partial structures represented by Formula (S1-1) to each other, an alkyl group is bonded to at least one bonding site, and a group having an ethylenically unsaturated bond is bonded to at least one bonding site may be mentioned. Examples of the linking group L include an alkylene group, and a divalent group formed by combination of an alkylene group and at least one selected from —O—, —CO—, —COO—, or —OCO—. Examples of the group having an ethylenically unsaturated bond include a vinyl group, a (meth)allyl group, and a (meth)acryloyl group.

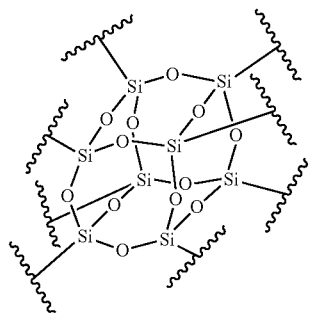

Formula (S1-1)

Examples of the alkoxysilane raw material include trialkoxysilane and tetraalkoxysilane. The alkoxysilane raw material preferably includes at least trialkoxysilane, and more preferably includes trialkoxysilane and tetraalkoxysilane. As the trialkoxysilane, a compound represented by Formula (S2) is preferable. As the tetraalkoxysilane, a compound represented by Formula (S3) is preferable.

  Formula (S2)

  Formula (S3)

($R^2$ and $R^3$ each independently represent an alkyl group.)

The number of carbon atoms of the alkyl group represented by each of $R^2$ and $R^3$ is preferably 1 to 10, more preferably 1 to 4, and still more preferably 1 to 3. The alkyl group represented by each of $R^2$ and $R^3$ is preferably a linear alkyl group. The alkyl group represented by each of $R^2$ and $R^3$ may have a substituent. Examples of the substituent include the substituents which may be contained in the above-mentioned alkyl group represented by $R^1$.

With regard to the details of the siloxane resin, reference can be made to the description in paragraph Nos. 0014 to 0039 of JP2014-063125A, JP2004-021036A, JP2011-084672A, and JP2007-254506A, the contents of which are incorporated herein by reference.

Examples of the fluorine resin include a resin containing fluorine in a molecule thereof. Specific examples thereof include polytetrafluoroethylene, polyhexafluoropropylene, a tetrafluoroethylene/hexafluoropropylene copolymer, a tetrafluoroethylene/perfluoroalkylvinyl ether copolymer, a tetrafluoroethylene/ethylene copolymer, a hexafluoropropylene/propylene copolymer, polyvinylidene fluoride, and a vinylidene fluoride/ethylene copolymer. Further, an amorphous fluorine resin is also preferably used, and examples of a commercially available product thereof include CYTOP (manufactured by Asahi Glass Co., Ltd.). The weight-average molecular weight of the fluorine resin such as polytetrafluoroethylene is preferably in the range of 100,000 to 10,000,000, and more preferably in the range of 100,000 to 1,000,000. Examples of the commercially available product of the polytetrafluoroethylene include TEFLON (registered trademark) 6-J, TEFLON (registered trademark) 6C-J, and TEFLON (registered trademark) 62-J, manufactured by Du Pont-Mitsui Fluorochemicals Co., Ltd., and FLUON CD1 and CD076, manufactured by Asahi-ICI Fluoropolymers Co., Ltd. In addition, as a commercially available product of a polytetrafluoroethylene-containing mixed powder including polytetrafluoroethylene particles and an organic polymer, the product is commercially available as "METABLEN (registered trademark)" A series from Mitsubishi Rayon Co., Ltd., and "METABLEN (registered trademark)" A-3000, "METABLEN (registered trademark)" A-3800, and the like are commercially available. In addition, in the present specification, a resin including a siloxane bond and a fluorine atom in a molecule thereof corresponds to a siloxane resin.

Moreover, it is also preferable that the partition walls in the present invention include colloidal silica particles. According to this aspect, partition walls having a low refractive index are easily formed. As a preferred aspect of the colloidal silica particles, the following first to third aspects may be mentioned.

First aspect: An aspect in which an average particle diameter $D_1$ measured by a dynamic light scattering method is 25 to 1,000 nm, and a ratio $D_1/D_2$ of the average particle diameter $D_1$ to the average particle diameter $D_2$ obtained by Equation (1) from a specific surface area S of colloidal silica particles measured by a nitrogen adsorption method is 3 or more.

$$D_2 = 2{,}720/S \qquad (1)$$

In the equation, $D_2$ is an average particle diameter with a unit of nm, and S is a specific surface area of colloidal silica particles measured by a nitrogen adsorption method with a unit of $m^2/g$.

Second aspect: An aspect in which a plurality of spherical silica particles are planarly linked.

Third aspect: An aspect in which a plurality of spherical silica particles are linked in a beaded shape.

The colloidal silica particles of the first aspect may satisfy the requirements of the colloidal silica particles of the second or third aspect. Further, the colloidal silica particles of the second aspect may satisfy the requirements of the colloidal silica particles of the first aspect. In addition, the colloidal silica particles of the third aspect may satisfy the requirements of the colloidal silica particles of the first aspect.

Moreover, in the present specification, a term of "spherical" means that the shape may be substantially spherical and may be modified within a range that the effect of the present invention is exhibited. For example, it is meant to include a shape having unevenness on a surface thereof or a flat shape having a major axis in a predetermined direction.

Furthermore, an expression of "a plurality of spherical silica particles are linked in a beaded shape" means a structure where a plurality of the spherical silica particles are linked to each other in a linear and/or branched shape. For example, as shown in FIG. 1, a structure where a plurality of spherical silica particles are linked to each other with a junction having a smaller outer diameter than those of the particles may be mentioned. Further, in the present invention, examples of the structure in a form in which "a plurality of spherical silica particles are linked in a beaded shape" include not only a structure in a form in which a plurality of the spherical silica particles are linked in a ring shape but also a structure in a chained form having a terminal.

Moreover, an expression of "a plurality of spherical silica particles are planarly linked" means that a plurality of spherical silica particles are linked to each other in substantially the same plane. In addition, an expression of "substantially the same plane" means not only a case of the same plane but also a case where the spherical silica particles may be shifted up and down from the same plane vertically. For example, the spherical silica particles may be shifted up and down vertically within a range of 50% or less of the particle diameters of the silica particles.

In the colloidal silica particles used in the present invention, the ratio $D_1/D_2$ of the average particle diameter $D_1$ measured by a dynamic light scattering method to the average particle diameter $D_2$ obtained by Equation (1) is preferably 3 or more. The upper limit of $D_1/D_2$ is not particularly limited, but is preferably 1,000 or less, more preferably 800 or less, and still more preferably 500 or less. By adjusting $D_1/D_2$ to such a range, it is possible to exhibit good optical properties and effectively suppress aggregation during drying. Incidentally, the value of $D_1/D_2$ in the colloidal silica particles is also an indicator of the linking degree of the spherical silica particles.

The average particle diameter $D_2$ of the colloidal silica particles can be regarded as an average particle diameter that approximates the primary particles of spherical silica. The average particle diameter $D_2$ is preferably 1 nm or more, more preferably 3 nm or more, still more preferably 5 nm or more, and particularly preferably 7 nm or more. The upper limit is preferably 100 nm or less, more preferably 80 nm or less, still more preferably 70 nm or less, even still more preferably 60 nm or less, and particularly preferably 50 nm or less.

The average particle diameter $D_2$ may be replaced by a circle-equivalent diameter (D0) in a projected image of a spherical portion as measured by a transmission electron microscope (TEM). Unless otherwise specified, the average particle diameter by the circle-equivalent diameter is evaluated by a number average of 50 or more particles.

The average particle diameter $D_1$ of the colloidal silica particles can be regarded as the number-average particle diameter of the secondary particles as a combination of a plurality of spherical silica particles. Therefore, usually, a relationship of $D_1 > D_2$ is satisfied. The average particle diameter $D_1$ is preferably 25 nm or more, more preferably 30 nm or more, and particularly preferably 35 nm or more. The upper limit is preferably 1,000 nm or less, more preferably 700 nm or less, still more preferably 500 nm or less, and particularly preferably 300 nm or less.

Measurement of the average particle diameter $D_1$ of the colloidal silica particles is performed using a dynamic light scattering type particle size distribution measuring device (Nanotrac Wave-EX150 [trade name] manufactured by Nikkiso Co., Ltd.) unless otherwise specified. The procedure is as follows. The dispersion liquid of the colloidal silica particles is taken into a 20 ml sample bottle, and adjusted after being diluted in toluene to a concentration of the solid content of 0.2% by mass. The diluted sample solution is irradiated with ultrasonic waves at 40 kHz for 1 minute and then immediately used for testing. Data capturing is carried out 10 times using a 2-ml quartz cell for measurement at a temperature of 25° C., and the obtained "number average" is taken as an average particle diameter. With regard to the other detailed conditions and the like, reference can be made to the description in JISZ8828: 2013 "Particle Size Analysis-Dynamic Light Scattering Method" as desired. Five samples are prepared per level and an average value thereof is employed.

In the colloidal silica particles, it is preferable that a plurality of spherical silica particles having an average particle diameter of 1 to 80 nm are linked via a linking material. The upper limit of the average particle diameter of the spherical silica particles is preferably 70 nm or less, more preferably 60 nm or less, and still more preferably 50 nm or less. Further, the lower limit of the average particle diameter of the spherical silica particles is preferably 3 nm or more, more preferably 5 nm or more, and still more preferably 7 nm more. In the present invention, as the value of the average particle diameter of the spherical silica particles, a value of the average particle diameter determined from a circle-equivalent diameter of a projected image of the spherical portion as measured with a transmission electron microscope (TEM) is used.

Examples of the linking material that links the spherical silica particles to each other include metal oxide-containing silica. Examples of the metal oxide include an oxide of a metal selected from Ca, Mg, Sr, Ba, Zn, Sn, Pb, Ni, Co, Fe, Al, In, Y, and Ti. Examples of the metal oxide-containing silica include reaction products of these metal oxides and silica ($SiO_2$), and mixtures thereof. With regard to the linking material, reference can be made to the description in WO2000/015552A, the contents of which are incorporated herein by reference.

The linking number of the spherical silica particles is preferably 3 or more, and more preferably 5 or more. The upper limit is preferably 1,000 or less, more preferably 800 or less, and still more preferably 500 or less. The linking number of the spherical silica particles can be measured by TEM.

The colloidal silica particles may be used in the state of a particle solution (sol). For example, the silica sol described in JP4328935B, or the like can be used. Examples of a medium for dispersing the colloidal silica particles include alcohols (for example, methanol, ethanol, and isopropanol (IPA)), ethylene glycol, glycol ethers (for example, propylene glycol monomethyl ether), and glycol ether acetate (for example, propylene glycol monomethyl ether acetate). Further, a solvent A1, a solvent A2, or the like which will be described later can also be used. The $SiO_2$ concentration in the particle solution (sol) is preferably 5% to 40% by mass. As the particle solution (sol), a commercially available product can also be used. Examples thereof include "SNOWTEX OUP", "SNOWTEX UP", "IPA-ST-UP", "SNOWTEX PS-M", "SNOWTEX PS-MO", "SNOWTEX PS-S", and "SNOWTEX PS-SO", manufactured by Nissan Chemical Corporation, "Fine Cataloid F-120" manufactured by Catalysts & Chemicals Industries Co., Ltd., and "Quartron PL" manufactured by Fuso Chemical Co., Ltd.

The width W1 of the partition walls 2 is preferably 20 to 500 nm, more preferably 20 to 300 nm, and still more preferably 20 to 200 nm. Further, the height H1 of the partition walls 2 is preferably 200 to 1,000 nm, and more preferably 300 to 700 nm, but is the same height as in the colored layers. A less height is preferable since a low profile of a solid-state imaging element can be made.

The pitch P1 of the partition walls 2 is preferably 2,000 to 500 nm, more preferably 1,500 to 500 nm, and still more preferably 1,000 to 500 nm in the applications of a high-pixel solid-state imaging element.

The colored layers 4 are formed in regions (openings of the partition walls) partitioned by the partition walls 2, on the support 1. The colored layers are not particularly limited. Examples thereof include colored layers in red, blue, green, magenta, cyan, and the like. Any of the colors and arrangements of the colored layers can be selected.

The width L1 of the colored layers 4 may be appropriately selected depending on the applications. For example, in the applications of a high-pixel solid-state imaging element, the width L1 is preferably 500 to 2,000 nm, more preferably 500 to 1,500 nm, and still more preferably 500 to 1,000 nm.

The height H2 of the colored layers 4 can be appropriately selected depending on the applications. For example, in the applications of a high-pixel solid-state imaging element, the height H2 is preferably 300 to 1,000 nm, more preferably 300 to 800 nm, and still more preferably 300 to 600 nm. In addition, the height H2 of the colored layers 4 is preferably 50% to 150%, more preferably 70% to 130%, and still more preferably 90% to 110%, of the height H1 of the partition walls 2.

The colored layers 4 can be formed using a coloring composition known in the related art. For example, a coloring composition including a coloring agent, a curable compound, a resin, and a solvent, and the like can be used. The coloring composition is preferably a photosensitive composition. Examples of the photocurable coloring composition include a composition including a photopolymerization initiator and a polymerizable compound. Further, the coloring composition preferably includes a compound having a group with an ethylenically unsaturated bond, and the content of the compound having a group with an ethylenically unsaturated bond is more preferably 5% to 50% by mass, and still more preferably 10% to 50% by mass, with respect to the total solid content of the coloring composition. According to this aspect, it is possible to improve the compatibility and the adhesiveness between the colored layers and the organic material layers. In addition, it is possible to effectively suppress the generation of voids even in a case where the structure is exposed to an environment having high humidity. The coloring composition will be described later in detail.

The structure 100 of the embodiment of the present invention has organic material layers 3 between the partition walls 2 and the colored layers 4. That is, as shown in FIG. 1, the side surface 2a of the partition walls 2 is covered with the organic material layers 3, and the colored layers 4 are in contact with the partition walls 2 via the organic material layers 3. Further, the colored layers 4 and the organic material layers 3 are compatible or reacted with each other to be integrated in some cases, and a clear interface between the both is not present in other cases.

Furthermore, in this embodiment, the organic material layers 3 are also formed between the support 1 and the colored layers 4. That is, in this embodiment, the side surface 2a of the partition walls 2 and the surface 1a of the support 1 are covered with the organic material layers 3 the respective regions partitioned by the partition walls 2 on the support 1. Further, the colored layers 4 are in contact with the partition walls 2 and the support 1 via the organic material layers 3. Further, in the structure of the embodiment of the present invention, the organic material layers 3 may not be formed between the support 1 and the colored layers 4, but from the viewpoint of the adhesiveness between the support 1 and the colored layers 4, or the moisture resistance, it is preferable that the organic material layers 3 are formed between the support 1 and the colored layers 4.

Moreover, in this embodiment, the organic material layers 3 are not formed on the upper surface 2b of the partition walls 2 but the organic material layers 3 may be formed on the upper surface 2b of the partition walls 2. From the viewpoint of reduction in the profile of the solid-state imaging element, it is preferable that the organic material layers 3 are not formed on the upper surface 2b of the partition walls 2.

It is preferable that the thickness L2 of the organic material layers 3 is low for a reason that the effective area of the colored layers 4 is increased, and the thickness L2 is more preferably 50 nm or less, still more preferably 40 nm or less, and particularly preferably 30 nm or less. The lower limit of the thickness L2 of the organic material layers 3 is preferably 5 nm or more from the viewpoints of adhesiveness, moisture resistance, and the like.

In the structure 100 of the embodiment of the present invention, the organic material layers 3 are formed of a composition including a compound having a group with an ethylenically unsaturated bond (a composition for forming an organic material layer). Hereinafter, the composition for forming an organic material layer will be described. This composition for forming an organic material layer is also the composition for forming an organic material layer that is the subject of the present invention.

Moreover, the structure 100 of the embodiment of the present invention may be provided with near-infrared transmitting filter layers in the regions partitioned by the partition walls 2 on the support 1. For example, in FIGS. 1 and 2, a portion of the colored layers 4 may be substituted with the near-infrared transmitting filter layers. The near-infrared transmitting filter layers may be filter layers having spectral characteristics of shielding visible light and transmitting at least a portion of the near-infrared rays. The near-infrared transmitting filter layer is, for example, preferably a filter layer having spectral characteristics that transmit at least a portion of the rays at a wavelength in the range of 700 to 2,500 nm, more preferably a filter layer having spectral characteristics that transmit at least a portion of the rays at a wavelength in the range of 700 to 2,000 nm, still more preferably a filter layer having spectral characteristics that transmit at least a portion of the rays at a wavelength in the range of 700 to 1,500 nm, even still more preferably a filter layer having spectral characteristics that transmit at least a portion of the rays at a wavelength in the range of 700 to 1,300 nm, and particularly preferably a filter layer having spectral characteristics that transmit at least a portion of the rays at a wavelength in the range of 700 to 1,000 nm. Incidentally, the near-infrared transmitting filter layer may be constituted with a film with one layer (mono-layered film) or may be a laminate of a film with two or more layers (multi-layered film). In addition, in a case where the near-infrared transmitting filter layer is constituted with the multi-layered film, the entire multi-layered film may have the above-mentioned spectral characteristics, or the mono-layered film itself may not have each the above-mentioned spectral characteristics.

The thickness of the near-infrared transmitting filter layer is not particularly limited. For example, the thickness is preferably 100 μm or less, more preferably 15 μm or less, still more preferably 5 μm or less, and particularly preferably 1 μm or less. The lower limit value is preferably 0.1 μm or more, more preferably 0.2 μm or more, and still more preferably 0.3 μm or more.

Preferred examples of the near-infrared transmitting filter layer include a filter layer having any one of spectral characteristics of following (1) to (4).

(1): A filter layer in which a maximum value in the wavelength range of 400 to 640 nm, of the transmittance of light in the thickness direction, is 20% or less (preferably 15% or less, and more preferably 10% or less), and a minimum value in the wavelength range of 800 to 1,300 nm of the transmittance, of light in the thickness direction, is 70% or more (preferably 75% or more, and more preferably 80% or more). According to this filter layer, it is possible to shield light at a wavelength in the range of 400 to 640 nm, and transmit near-infrared rays at a wavelength of 720 nm or more.

(2): A filter layer in which a maximum value in the wavelength range of 400 to 750 nm, of the transmittance of light in the thickness direction, is 20% or less (preferably 15% or less, and more preferably 10% or less), and a minimum value in the wavelength range of 900 to 1,300 nm of the transmittance, of light in the thickness direction, is 70% or more (preferably 75% or more, and more preferably 80% or more). According to this filter layer, it is possible to shield light at a wavelength in the range of 400 to 750 nm, and transmit near-infrared rays at a wavelength of 850 nm or more.

(3): A filter layer in which a maximum value in the wavelength range of 400 to 850 nm, of the transmittance of light in the thickness direction, is 20% or less (preferably 15% or less, and more preferably 10% or less), and a minimum value in the wavelength range of 1,000 to 1,300 nm of the transmittance, of light in the thickness direction, is 70% or more (preferably 75% or more, and more preferably 80% or more). According to this filter layer, it is possible to shield light at a wavelength in the range of 400 to 850 nm, and transmit near-infrared rays at a wavelength of 940 nm or more.

(4): A filter layer in which a maximum value in the wavelength range of 400 to 950 nm of the transmittance, of light in the thickness direction, is 20% or less (preferably 15% or less, and more preferably 10% or less), and a minimum value in the wavelength range of 1,100 to 1,300 nm of the transmittance, of light in the thickness direction, is 70% or more (preferably 75% or more, and more preferably 80% or more). According to this filter layer, it is possible to shield light at a wavelength in the range of 400 to 950 nm, and transmit near-infrared rays at a wavelength of 1,040 nm or more.

(Compound Having Group with Ethylenically Unsaturated Bond)

The composition for forming an organic material layer of an embodiment of the present invention may include a compound having a group with an ethylenically unsaturated bond. Examples of the group having an ethylenically unsaturated bond include a vinyl group, a (meth)allyl group, a (meth)acryloyl group, and a styrene group, with the (meth)allyl group and the (meth)acryloyl group being preferable.

The compound having a group with an ethylenically unsaturated bond may be either a monomer or a resin such as a polymer. As the compound having a group with an ethylenically unsaturated bond, a resin having a group with an ethylenically unsaturated bond is preferable. In a case where the resin having a group with an ethylenically unsaturated bond is used, the composition for forming an organic material layer can be more uniformly applied onto the partition walls. Thus, the film-forming properties of the composition for forming an organic material layer can be improved. Further, the adhesiveness between the organic material layers and the colored layers can be enhanced, and better moisture resistance is obtained. Hereinafter, a monomer type of the compound having a group with an ethylenically unsaturated bond is also referred to as a monomer A. In addition, a resin type of the compound having a group with an ethylenically unsaturated bond is also referred to as a resin A.

The molecular weight of the monomer A is preferably 100 to 3,000. The upper limit is preferably 2,000 or less, and more preferably 1,500 or less. The lower limit is preferably 150 or more, and more preferably 250 or more.

The weight-average molecular weight of the resin A is preferably 5,000 to 20,000. The upper limit is preferably 19,000 or less, and more preferably 18,000 or less. The lower limit is preferably 8,000 or more, and more preferably 10,000 or more.

The content of the compound having a group with an ethylenically unsaturated bond is preferably 0.01 to 1% by mass with respect to the total mass of the composition for forming an organic material layer. The lower limit is preferably 0.05% by mass or more, and more preferably 0.1% by mass or more. The upper limit is preferably 0.9% by mass or less, and more preferably 0.8% by mass or less.

The content of the compound having a group with an ethylenically unsaturated bond in the total solid content of the composition for forming an organic material layer is preferably 50% to 100% by mass. The lower limit is preferably 70% by mass or more, and more preferably 90% by mass or more.

The content of the compound of the resin A in the compound having a group with an ethylenically unsaturated bond is preferably 50% to 100% by mass, more preferably 70% to 100% by mass, and still more preferably 90% to 100% by mass, and it is particularly preferable that the compound having a group with an ethylenically unsaturated bond is constituted substantially only with the resin A.

Accordingly this aspect, the film-forming properties of the organic material layer are good and more excellent moisture resistance is easily obtained. In addition, in a case where the compound having a group with an ethylenically unsaturated bond is constituted with substantially only the resin A, the content of the resin A in the compound having a group with an ethylenically unsaturated bond is preferably 99% by mass or more, more preferably 99.5% by mass or more, and still more preferably 99.9% by mass or more, and it is particularly preferable that the compound having a group with an ethylenically unsaturated bond is constituted only with the resin A.

In the present invention, it is also preferable that the monomer A and the resin A are used in combination as the compound having a group with an ethylenically unsaturated bond.

(Monomer A)

The monomer A is preferably a trifunctional to pentadecafunctional (meth)acrylate compound, and more preferably a trifunctional to hexafunctional (meth)acrylate compound. Specific examples thereof include the compounds described in paragraph Nos. 0095 to 0108 of JP2009-288705A, paragraph No. 0227 of JP2013-029760A, and paragraph Nos. 0254 to 0257 of JP2008-292970A, the contents of which are incorporated herein by reference.

As the monomer A, compounds represented by Formula (MO-1) to Formula (MO-5) can also be suitably used. Further, in a case where T is an oxyalkylene group in the formulae, a terminal on the carbon atom side is bonded to R.

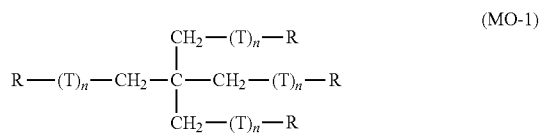

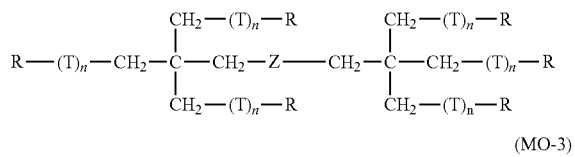

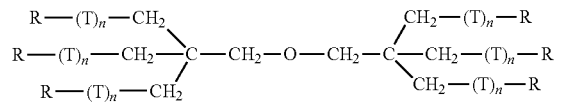

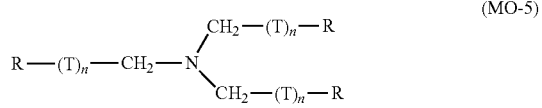

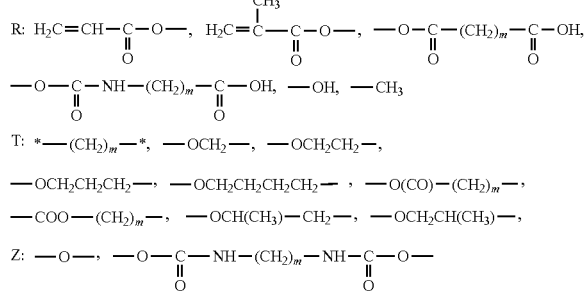

In the formulae, n is 0 to 14 and m is 1 to 8. R's, T's, and Z's which are present in plural numbers in one molecule may each be the same as or different from each other.

In each of the compounds represented by Formula (MO-1) to (MO-5), at least one of R's which are present in plural numbers represents a group represented by —OC(=O)CH=CH$_2$ or —OC(=O)C(CH$_3$)=CH$_2$.

Specific examples of the compounds represented by Formula (MO-1) to (MO-5) include the compounds described in paragraph Nos. 0248 to 0251 of JP2007-269779A, the contents of which are incorporated herein by reference.

Furthermore, as the monomer A, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E manufactured by Shin-Nakamura Chemical Co., Ltd.), and a structure where these (meth)acryloyl groups are bonded via an ethylene glycol and/or propylene glycol residue (for example, SR454 and SR499, commercially available from Sartomer Company, Inc.) are preferable. Oligomer types of these can also be used. In addition, as the monomer A, a trifunctional (meth)acrylate compound such as trimethylolpropane tri(meth)acrylate, trimethylolpropane propyleneoxy-modified tri(meth)acrylate, trimethylolpropane ethyleneoxy-modified tri(meth)acrylate, isocyanuric acid ethyleneoxy-modified tri(meth)acrylate, and pentaerythritol tri(meth)acrylate can also be preferably used. Examples of commercially available products of the trifunctional (meth)acrylate compound include ARONIX M-309, M-310, M-321, M-350, M-360, M-313, M-315, M-306, M-305, M-303, M-452, and M-450 (manufactured by Toagosei Co., Ltd.), NK Ester A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

Examples of commercially available products of the compound having an alkyleneoxy group include SR-494 which is a tetrafunctional acrylate having four ethyleneoxy groups, manufactured by Sartomer Corporation, and DPCA-60 which is a hexafunctional acrylate having six pentyleneoxy groups and TPA-330 which is a trifunctional acrylate having three isobutyleneoxy groups, manufactured by Nippon Kayaku. Co., Ltd.

The monomer A may further have an acid group such as a carboxyl group, a sulfo group, and a phosphoric acid group. Examples of a commercially available product thereof include ARONIX M-305, M-510, and M-520, manufactured by Toagosei Co., Ltd.

In another preferred aspect, the monomer A is a compound having a caprolactone structure. The compound having a caprolactone structure is commercially available as, for example, KAYARAD DPCA series from Nippon Kayaku Co., Ltd., and examples thereof include DPCA-20, DPCA-30, DPCA-60, and DPCA-120. It is also preferable that a compound having an alkyleneoxy group is used as the monomer A. The compound having an alkyleneoxy group is preferably a compound having an ethyleneoxy group and/or a propyleneoxy group, more preferably a compound having an ethyleneoxy group, and still more preferably a trifunctional to hexafunctional (meth)acrylate compound having 4 to 20 ethyleneoxy groups. Examples of a commercially available product of the compound having an alkyleneoxy group include SR-494 which is a tetrafunctional (meth)acrylate having four ethyleneoxy groups, manufactured by Sartomer Corporation, and KAYARAD TPA-330 which is a trifunctional (meth)acrylate having three isobutyleneoxy groups. In addition, it is also preferable that the following compound is used.

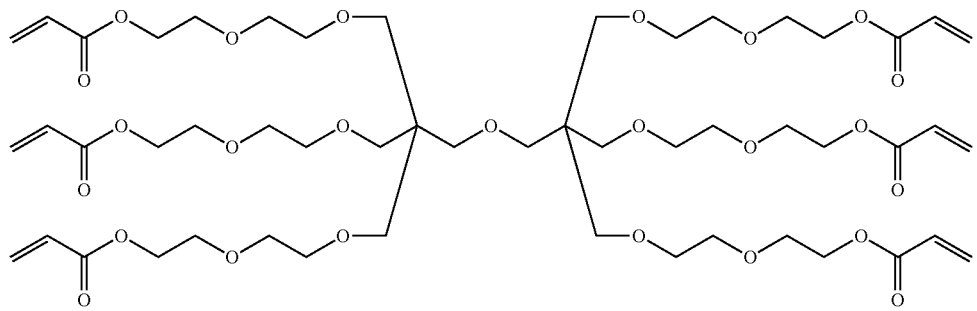 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

(Resin A)

In the present invention, as the resin A, a polymer including the repeating unit including a group with an ethylenically unsaturated bond in a side chain is preferable, and a polymer having a repeating unit represented by Formula (1) is more preferable.

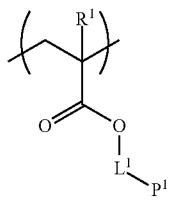

In the formula, $R^1$ represents a hydrogen atom or an alkyl group, $L^1$ represents a single bond or a divalent linking group, and $P^1$ represents a group with an ethylenically unsaturated bond.

The alkyl group represented by $R^1$ is preferably an alkyl group having 1 to 3 carbon atoms, and preferably a methyl group. $R^1$ is preferably a hydrogen atom or a methyl group. $L^1$ represents a single bond or a divalent linking group. Examples of the divalent linking group include an alkylene group having 1 to 30 carbon atoms, an arylene group having 6 to 12 carbon atoms, and a group formed by combining this group with one selected from —CO—, —OCO—, —O—, —NH—, and —SO$_2$—. The alkylene group and the arylene group may have a substituent or may be unsubstituted. Examples of the substituent include a halogen atom, an alkyl group, an aryl group, a hydroxyl group, a carboxyl group, an alkoxy group, and an aryloxy group. The hydroxyl group is preferable. The alkylene group may be in any one of linear, branched, and cyclic forms.

$P^1$ represents a group with an ethylenically unsaturated bond. As the group having an ethylenically unsaturated bond, a vinyl group, a (meth)allyl group, or a (meth)acryloyl group is preferable, and for a reason that the polymerization reactivity is high and more excellent moisture resistance is easily obtained, the (meth)acryloyl group is more preferable.

In the resin A, the content of the repeating unit including a group with an ethylenically unsaturated bond in a side chain is preferably 5% to 100% by mass of all the repeating units. The lower limit is preferably 10% by mass or more, and more preferably 15% by mass or more. The upper limit is preferably 90% by mass or less, more preferably 80% by mass or less, still more preferably 75% by mass or less, and particularly preferably 70% by mass or less.

It is also preferable that the resin A further includes a repeating unit having an acid group. Examples of the acid group include a carboxyl group, a sulfo group, and a phosphoric acid group. One type or two or more types of the acid groups may be included. The ratio of the repeating unit having an acid group is preferably 1% to 50% by mass of all the repeating units constituting the polymer. The lower limit is more preferably 2% by mass or more, and still more preferably 3% by mass or more. The upper limit is more preferably 35% by mass or less, and still more preferably 30% by mass or less.

In a case where the resin A has the acid group, the acid value of the resin A is preferably 10 to 100 mgKOH/g. The lower limit is preferably 15 mgKOH/g or more, and more preferably 20 mgKOH/g or more. The upper limit is preferably 90 mgKOH/g or less, more preferably 80 mgKOH/g or less, still more preferably 70 mgKOH/g or less, and particularly preferably 60 mgKOH/g or less.

It is also preferable that the resin A further includes a repeating unit having an aryl group in the side chain. The ratio of the repeating unit having an aryl group in the side chain is preferably 1% to 80% by mass of all the repeating units constituting the polymer. The lower limit is more preferably 10% by mass or more, and still more preferably 15% by mass or more. The upper limit is more preferably 70% by mass or less, and still more preferably 60% by mass or less.

It is also preferable that the resin A further includes a polymer formed by polymerizing monomer components including at least one compound selected from a compound represented by Formula (ED1) or the compound represented by Formula (1) of JP2010-168539A (these compounds are hereinafter also referred to as an "ether dimer" in some cases).

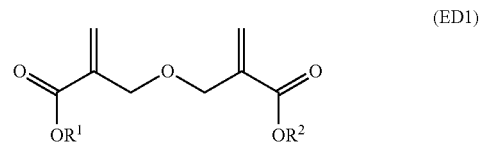

In Formula (ED1), $R^1$ and $R^2$ each independently represent a hydrogen atom or a hydrocarbon group having 1 to 25 carbon atoms, which may have a substituent.

With regard to specific examples of the ether dimer, reference can be made to paragraph No. 0317 of JP2013-029760A, the contents of which are incorporated herein by reference. These ether dimers may be of one kind or of two or more kinds.

Specific examples of the resin A include polymers having the following structures. In the following structural formulae, Me represents a methyl group.

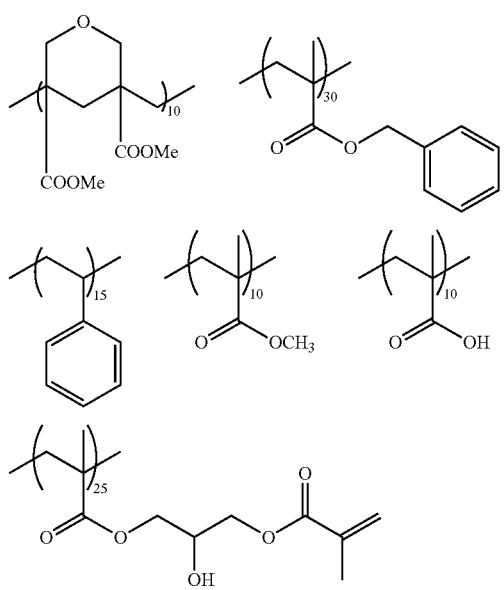

-continued

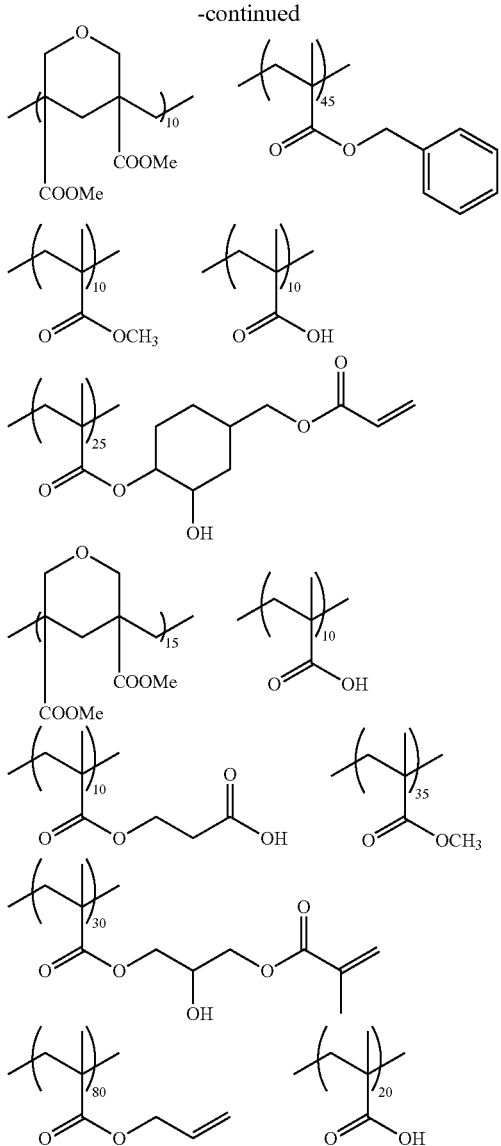

As the resin A, a commercially available product thereof can also be used. Examples thereof include DIANAL NR Series (manufactured by Mitsubishi Rayon Co., Ltd.), PHOTOMER 6173 (COOH-containing polyurethane acrylic oligomer, manufactured by Diamond Shamrock Co., Ltd.), VISCOAT R-264 and KS RESIST 106 (both manufactured by Osaka Organic Chemical Industry Ltd.), CYCLOMER P Series (for example, ACA230AA), PLACCEL CF200 Series (all manufactured by Daicel Corporation), Ebecryl 3800 (manufactured by Daicel-UCB Co., Ltd.), and ACRYCURE RD-F8 (manufactured by Nippon Shokubai Co., Ltd.).

(Surfactant)

From the viewpoint of further improving coatability, the composition for forming an organic material layer of the embodiment of the present invention may contain various surfactants. As the surfactant, various surfactants such as a fluorine-based surfactant, a nonionic surfactant, a cationic surfactant, an anionic surfactant, and a silicone-based surfactant can be used. Among those, the fluorine-based surfactant is preferable. By incorporating the fluorine-based surfactant into the composition for forming an organic material layer of the embodiment of the present invention, more excellent coatability is easily obtained. As a result, an organic material layer which is a thin film and has uniform film thickness is easily formed.

The fluorine content in the fluorine-based surfactant is preferably 3% to 40% by mass, more preferably 5% to 30% by mass, and particularly preferably 7% to 25% by mass. The fluorine-based surfactant in which the fluorine content is within this range is effective in terms of the thickness evenness of a coating film or liquid saving properties.

Examples of the fluorine-based surfactant include MEGAFACE F171, F172, F173, F176, F177, F141, F142, F143, F144, R30, F437, F475, F479, F482, F554, F780, EXP, and MFS-330 (all manufactured by DIC Corporation), FLUORAD FC430, FC431, and FC171 (all manufactured by Sumitomo 3M), SURFLON S-382, SC-101, SC-103, SC-104, SC-105, SC-1068, SC-381, SC-383, S-393, and KH-40 (all manufactured by Asahi Glass Co., Ltd.), and PF636, PF656, PF6320, PF6520, and PF7002 (all manufactured by OMNOVA). Further, as the fluorine-based surfactant, the compounds described in paragraph Nos. 0015 to 0158 of JP2015-117327A, and the compounds described in paragraph Nos. 0117 to 0132 of JP2011-132503A can be used. As the fluorine-based surfactant, a block polymer can also be used, and specific examples thereof include the compounds described in JP2011-089090A.

As the fluorine-based surfactant, an acrylic compound in which by application of heat to a molecular structure containing a functional group having a fluorine atom, in which the functional group containing a fluorine atom is cut to volatilize a fluorine atom, can also be suitably used. Examples of the fluorine-based surfactant include MEGAFACE DS series (manufactured by DIC Corporation, The Chemical Daily, Feb. 22, 2016, and Nikkei Business Daily, Feb. 23, 2016), for example, MEGAFACE DS-21.

It is also preferable that a polymer of a fluorine atom-containing vinyl ether compound having a fluorinated alkyl group or a fluorinated alkylene ether group and a hydrophilic vinyl ether compound is used as a fluorine-based surfactant. With regard to such a fluorine-based surfactant, reference can be made to the description in JP2016-216602A, the contents of which are incorporated herein by reference.

As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used, and the following compounds are also exemplified as a fluorine-based surfactant for use in the present invention. In the following formulae, % representing the ratio of the repeating unit is % by mass.

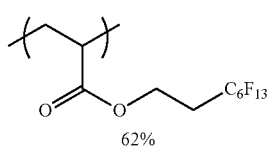

-continued

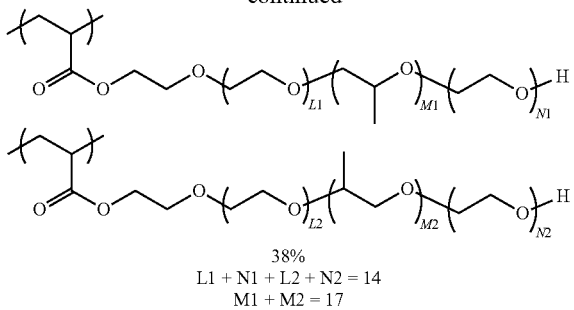

38%
L1 + N1 + L2 + N2 = 14
M1 + M2 = 17

The weight-average molecular weight of the compounds is preferably 3,000 to 50,000, and is, for example, 14,000.

A fluorine-containing polymer having an ethylenically unsaturated bonding group in a side chain thereof can also be used as the fluorine-based surfactant. Specific examples thereof include the compounds described in paragraph Nos. 0050 to 0090 and paragraph Nos. 0289 to 0295 of JP2010-164965A. Examples of commercially available products thereof include MEGAFACE RS-101, RS-102, RS-718-K, and RS-72-K, all of which are manufactured by DIC Corporation.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSEPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin chemical industry Co., Ltd.).

Examples of the cationic surfactant include an organosiloxane polymer KP341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Examples of the anionic surfactant include W004, W005, and W017 (manufactured by Yusho Co., Ltd.), and BL (manufactured by Sanyo Chemical Industries, Ltd.).

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and BYK307, BYK323, and BYK330 (all manufactured by BYK Chemie).

The content of the surfactant is preferably 0.0001% to 0.1% by mass with respect to the total mass of the composition for forming an organic material layer. The lower limit is preferably 0.0005% by mass or more, and more preferably 0.001% by mass or more. The upper limit is preferably 0.05% by mass or less, and more preferably 0.01% by mass or less.

The content of the surfactant in the total solid content of the composition for forming an organic material layer is preferably 0.01% to 2.0% by mass. The lower limit is preferably 0.05% by mass or more, and more preferably 0.1% by mass or more. The upper limit is preferably 1.5% by mass or less, and more preferably 1.0% by mass or less.

The surfactants may be used singly or in combination of two or more kinds thereof. In a case where two or more kinds of the surfactants are used in combination, the total amount thereof is preferably within the range.

(Solvent)

The composition for forming an organic material layer of the embodiment of the present invention preferably contains a solvent. The solvent is preferably an organic solvent. The solvent is not particularly limited as long as it satisfies the solubility of the respective components or the coatability of the composition for forming an organic material layer.

Examples of the organic solvent include the following organic solvents: esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, cyclopentanone, 2-heptanone, and 3-heptanone; and aromatic hydrocarbons such as toluene and xylene. However, it is preferable in some cases to reduce aromatic hydrocarbons (benzene, toluene, xylene, ethylbenzene, and the like) (for example, the amount can be set to 50 parts per million (ppm) by mass or less, 10 ppm by mass or less, or 1 ppm by mass or less with respect to the total amount of the organic solvent) as a solvent for a reason such as an environmental aspect.

The organic solvents may be used singly or in combination of two or more kinds thereof. In a case where the organic solvents are used in combination of two or more kinds thereof, it is particularly preferable that the solvent is a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, the organic solvent E preferably has a content of peroxides of 0.8 mmol/L or less, and more preferably, it does not substantially include peroxides. Further, it is preferable to use an organic solvent having a small metal content, and for example, the metal content of the organic solvent is preferably 10 parts per billion (ppb) by mass or less. The metal content of the organic solvent is at a level of parts per trillion (ppt) by mass, as desired, and such a high-purity solvent is provided by, for example, Toyo Kasei Kogyo Co., Ltd. (The Chemical Daily, Nov. 13, 2015).

The content of the solvent is preferably 99% to 99.99% by mass with respect to the total mass of the composition for forming an organic material layer. The lower limit is preferably 99.2% by mass or more, and more preferably 99.4% by mass or more. The upper limit is preferably 99.95% by mass or less, and more preferably 99.9% by mass or less. In a case where the content of the solvent is within the range, the coatability of the composition for forming an organic material layer is good, and an organic material layer which is a thin film and has a small film thickness deviation is easily formed.

The composition for forming an organic material layer of the embodiment of the present invention may further contain an epoxy resin, but it is preferable that the composition for forming an organic material layer does not substantially contain the epoxy resin. According to this aspect, a structure having excellent moisture resistance is easily formed. Further, in a case where the composition for forming an organic material layer does not substantially contain the epoxy resin, the content of the epoxy resin is preferably 1% by mass or less, more preferably 0.1% by mass or less, and still more preferably 0.01% by mass or less, with respect to the total solid content of the composition for forming an organic material layer, and it is particularly preferable that the composition does not contain the epoxy resin.

The composition for forming an organic material layer of the embodiment of the present invention may further include another additive such as a photopolymerization initiator and a polymerization inhibitor, the content of such another additive is preferably 1% by mass or less, and more preferably 0.1% by mass or less, with respect to the total solid content of the composition for forming an organic material layer, and it is still more preferable that the composition does not substantially contain such another additive. In addition, in a case where the composition does not substantially contain such another additive, the content of such another additive is preferably 1% by mass or less, more preferably 0.1% by mass or less, and still more preferably 0.01% by mass or less, with respect to the total solid content of the composition for forming an organic material layer, and it is particularly preferable that the composition does not contain such another additive.

<Method for Producing Structure>

Next, the method for producing a structure of an embodiment of the present invention will be described. The method for producing a structure of the embodiment of the present invention includes a step of forming partition walls on a support, a step of forming organic material layers using a composition for forming an organic material layer, including a compound having a group with an ethylenically unsaturated bond, on the surface of the partition walls, and a step of forming colored layers in regions partitioned by the partition walls having the organic material layer formed on the surface thereof, on the support.

The partition walls can be formed using a method known in the related art. For example, the partition walls can be formed in the following manner.

First, a partition wall material layer is formed on a support. In a case where partition walls are formed of an organic material, an acrylic resin, a polystyrene-based resin, a polyimide-based resin, an organic SOG-based resin, or the like is applied onto a support, and then thermosetting and the like are performed to form a film, thereby a partition wall material layer. Further, in a case where the partition walls are formed of an inorganic material, a porous silica film, a polycrystalline silicon film, a silicon oxide film, a silicon nitride film, or a metal film (for example, a tungsten film and an aluminum film) is formed using a chemical vapor deposition (CVD) method, a plasma CVD method, a sputtering method, or the like, thereby forming a partition wall material layer.

Subsequently, a resist pattern is formed on the partition wall material layer using a mask having a pattern according to the shape of the partition wall. Subsequently, the partition wall material layer is subjected to etching using the resist pattern as a mask by a dry etching method. Then, the resist pattern is peeled and removed from the partition wall material layer to form partition walls. In addition, the partition walls can also be formed by the method described in JP2006-128433A.

Next, organic material layers are formed on the surface of the partition walls formed on the support, using a composition for forming an organic material layer, including a compound having a group with an ethylenically unsaturated bond (the composition for forming an organic material layer of the embodiment of the present invention). The organic material layers may be formed on at least the side surface (Reference 2a in FIG. 1) of the partition walls. The organic material layers may or may not be formed on an upper surface (Reference 2b in FIG. 1) of the partition walls.

The organic material layers can be formed through a step of applying a composition for forming an organic material layer onto the surface of the partition walls to form layers with the composition for forming an organic material layer, and a step of drying the layers with the composition for forming an organic material layer.

A method for applying the composition for forming an organic material layer is not particularly limited, and examples thereof include a spin coating method, a slit coating method, an ink jet method, a dip coating method, and a screen printing method. Among those, the spin coating method is preferable for a reason that a film can be uniformly formed with a small amount.

A condition for drying the layers with the composition for forming an organic material layer is not particularly limited. For example, the drying temperature is preferably 60° C. to 150° C. The upper limit of the drying temperature is preferably 130° C. or lower, and more preferably 110° C. or lower. The lower limit of the drying temperature is preferably 80° C. or higher, and more preferably 90° C. or higher. The drying time is preferably 60 seconds to 600 seconds. The upper limit of the drying time is preferably 300 seconds or less, and more preferably 180 seconds or less. The lower limit of the drying time is preferably 80 seconds or more, and more preferably 100 seconds or more. The drying can be performed using a hot plate, an oven, or the like.

The layers with the composition for forming an organic material layer can be subjected to a heating treatment (postbaking) after performing drying. In a case where the postbaking is performed, the postbaking temperature is preferably, for example, 180° C. to 260° C. The upper limit of the postbaking temperature is preferably 250° C. or lower, and more preferably 240° C. or lower. The lower limit of the postbaking temperature is preferably 190° C. or higher, and more preferably 200° C. or higher. The postbaking time is preferably 60 seconds to 600 seconds. The upper limit of the postbaking time is preferably 300 seconds or less, and more preferably 180 seconds or less. The lower limit of the postbaking time is preferably 80 seconds or more, and more preferably 100 seconds or more. The postbaking can be performed using a hot plate, an oven, or the like.

Next, colored layers are formed in the regions partitioned by the partition walls having the organic material layers formed on the surface thereof, on the support. The colored layers can be formed using a coloring composition known in the related art. For example, a method in which a pattern is formed by a photolithography method using a photosensitive composition as the coloring composition and colored layers are formed in the regions partitioned by the partition walls may be mentioned. A pattern forming method using a photolithography method preferably includes a step of forming a coloring composition layer on a support using a coloring composition, a step of patternwise exposing the coloring composition layer, and a step of developing the exposed photosensitive composition layer. Hereinafter, each of the steps will be described.

The coloring composition layer can be formed by applying a coloring composition onto a support. As a method for applying the coloring composition, a method known in the related art can be used. Examples thereof include a spin coating method, a slit coating method, an ink jet method, a dip coating method, and a screen printing method.

The coloring composition layer formed on the support may be dried (prebaked). The prebaking temperature is preferably 120° C. or lower, more preferably 110° C. or lower, and still more preferably 105° C. or lower. The lower limit can be set to, for example, 50° C. or higher, or to 80° C. or higher. The prebaking time is preferably 10 seconds to 300 seconds, more preferably 40 to 250 seconds, and still more preferably 80 to 220 seconds. The prebaking can be performed using a hot plate, an oven, or the like.

Next, the coloring composition layer is patternwise exposed. For example, the coloring composition layer can be subjected to patternwise exposure by performing exposure using an exposure device such as a stepper through a mask having a predetermined mask pattern. Thus, the exposed portion can be cured. As the radiation (light) which can be used during the exposure, ultraviolet rays such as g-rays and i-rays (particularly preferably i-rays) are preferably used. The irradiation dose (exposure dose) is, for example, preferably 0.03 to 2.5 J/cm$^2$, and more preferably 0.05 to 1.0 J/cm$^2$. The oxygen concentration during the exposure can be appropriately selected, and may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to performing the exposure in air atmosphere. Further, the exposure illuminance can be appropriately set, and can be usually selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the illuminance of exposure energy may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

Next, a pattern is formed by removing unexposed areas by of the coloring composition layer by development. Removal of the unexposed areas by of the coloring composition layer by development can be performed using a developer. As the developer, an alkali developer is preferable. The temperature of the developer is preferably, for example, 20° C. to 30° C., and the development time is preferably 20 to 180 seconds.

As the developer, an aqueous alkaline solution obtained by diluting an alkali agent with pure water is preferably used. Examples of the alkali agent include organic alkaline compounds such as aqueous ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. The concentration of the alkali agent in the aqueous alkaline solution is preferably 0.001% to 10% by mass, and more preferably 0.01% to 1% by mass. Moreover, the developer may further include a surfactant. Examples of the surfactant include the surfactants described as the above-mentioned composition for forming an organic material layer, and the surfactant is preferably a nonionic surfactant.

After the development, a heating treatment (postbaking) can also be performed after carrying out drying. The postbaking is a heating treatment after development so as to complete the curing of the film. In a case of performing the postbaking, the postbaking temperature is preferably, for example, 100° C. to 240° C. From the viewpoint of curing of the film, the postbaking temperature is more preferably 200° C. to 230° C.

Next, the coloring composition that can be used to form colored layers will be described.

(Coloring Composition)

The coloring composition preferably contains a coloring agent. The coloring agent may be any one of a dye or a pigment, both of which may be used in combination. Examples of the inorganic pigment include black pigments such as carbon black and titanium black, oxides of metals such as iron, cobalt, aluminum, cadmium, lead, copper, titanium, magnesium, chromium, zinc, and antimony, and complex oxides of the metals. Examples of the organic pigments include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all red pigments);

C. I. Pigment Green 7, 10, 36, 37, 58, and 59 (all green pigments);

C. I. Pigment Violet 1, 19, 23, 27, 32, 37, 42, 58, and 59 (all violet pigments);

C. I. Pigment Blue 1, 2, 15, 15:1, 15:2, 15:3, 15:4, 15:6, 16, 22, 60, 64, 66, 79, and 80 (all blue pigments).

Moreover, as the green pigment, a halogenated zinc phthalocyanine pigment in which the average number of halogen atoms per molecule of the phthalocyanine is 10 to 14, the average number of bromine atoms per molecule of the phthalocyanine is 8 to 12, and the average number of chlorine atoms per molecule of the phthalocyanine is 2 to 5 can also be used. Specific examples thereof include the compounds described in WO2015/118720A.

In addition, as the blue pigment, an aluminum phthalocyanine compound having a phosphorus atom can also be used. Specific examples thereof include the compounds described in paragraph Nos. 0022 to 0030 of JP2012-247591A and the compounds described in paragraph No. 0047 of JP2011-157478A.

As the dye, for example, the dyes disclosed in JP1989-090403A (JP-S64-090403A), JP1989-091102A (JP-S64-091102A), JP1989-094301A (JP-H01-094301A), JP1994-011614A (JP-H06-011614A), U.S. Pat. Nos. 4,808,501A, 5,667,920A, JP1993-333207A (JP-H05-333207A), JP1994-035183A (JP-H06-035183A), JP1994-051115A (JP-H06-051115A), and JP1994-194828A (JP-H06-194828A) can be used. In terms of classification based on the chemical structure, examples of the dye include a pyrazoleazo compound, a pyrromethene compound, an anilinoazo compound, a triarylmethane compound, an anthraquinone compound, a benzylidene compound, an oxonol compound, a pyrazolotriazoleazo compound, a pyridoneazo compound, a cyanine compound, a phenothiazine compound, and a pyrrolopyrazoleazomethine compound.

Moreover, a dye multimer may be used as the coloring agent. The dye multimer is preferably a dye that is used after being dissolved in a solvent, but the dye multimer may form a particle. In a case where the dye multimer is the particle, it is usually used in a state of being dispersed in a solvent or the like. The dye multimer in the particle state can be obtained by, for example, emulsion polymerization. Examples of the dye multimer in the state of particles include the compounds described in JP2015-214682A. In addition, as the dye multimer, the compounds described in JP2011-213925A, JP2013-041097A, JP2015-028144A, JP2015-030742A, or the like can also be used.

In addition, as the yellow coloring agent, the quinophthalone compounds described in paragraph Nos. 0011 to 0034 of JP2013-054339A, the quinophthalone compounds described in paragraph Nos. 0013 to 0058 of JP2014-026228A, or the like can also be used.

The content of the coloring agent is preferably 10% by mass or more, more preferably 20% by mass or more, and still more preferably 30% by mass or more, with respect to the total solid content in the coloring composition. The upper limit thereof is preferably 80% by mass or less, more preferably 75% by mass or less, and still more preferably 70% by mass or less. The coloring agent included in the coloring composition may be of one kind or two or more kinds. In a case where two or more kinds of the coloring agents are included, the total amount thereof is preferably within the range.

The coloring composition preferably contains a curable compound. As the curable compound, a known compound which can be crosslinked by a radical, an acid, or heat can be used. Examples of the curable compound include a polymerizable compound and a compound having an epoxy group, with the polymerizable compound being preferable. Examples of the polymerizable compound include a compound having a group with an ethylenically unsaturated bond, such as a vinyl group, a (meth)allyl group, and a (meth)acryloyl group. The polymerizable compound is more preferably a radically polymerizable compound. The polymerizable compound may be any of chemical forms such as a monomer, a prepolymer, an oligomer, and the like, with the monomer being preferable. The molecular weight of the polymerizable compound is preferably 100 to 3,000. The upper limit is more preferably 2,000 or less, and still more preferably 1,500 or less. The lower limit is more preferably 150 or more, and still more preferably 250 or more. The polymerizable compound is preferably a trifunctional to pentadecafunctional (meth)acrylate compound, and more preferably a trifunctional to hexafunctional (meth)acrylate compound. With regard to these specific examples, reference can be made to the compounds described in paragraph Nos. 0095 to 0108 of JP2009-288705A, paragraph 0227 of JP2013-029760A, and paragraph Nos. 0254 to 0257 of JP2008-292970A, the contents of which are incorporated herein by reference. In addition, as the polymerizable compound, the compound having a group with an ethylenically unsaturated bond described for the above-mentioned composition for forming an organic material layer can also be used.

The content of the curable compound is preferably 0.1% to 50% by mass with respect to the total solid content of the coloring composition. The lower limit is more preferably, for example, 0.5% by mass or more, and still more preferably 1% by mass or more. The upper limit is more preferably, for example, 45% by mass or less, and still more preferably 40% by mass or less. The curable compounds may be used singly or in combination of two or more kinds thereof. In a case where two or more kinds of the curable compounds are used in combination, the total amount thereof is preferably within the range.

In a case where a polymerizable compound is used as the curable compound, it is preferable that the coloring composition further contains a photopolymerization initiator. Examples of the photopolymerization initiator include halogenated hydrocarbon derivatives (for example, a compound having a triazine skeleton and a compound having an oxadiazole skeleton), acylphosphine compounds such as acylphosphine oxide, hexaaryl biimidazole compounds, oxime compounds such as an oxime derivative, organic peroxides, thio compounds, ketone compounds, aromatic onium salts, ketoxime ether compounds, aminoacetophenone compounds, hydroxyacetophenone compounds, and phenyl glyoxylate compounds. The aminoacetophenone compound, the acylphosphine compound, the hydroxyacetophenone compound, and the oxime compound are preferable, and the oxime compound is more preferable. With regard to specific examples of the photopolymerization initiator, reference can be made to the description in paragraph Nos. 0265 to 0268 of JP2013-029760A, the contents of which are incorporated herein by reference. Examples of a commercially available product of the oxime compound include IRGACURE-OXE01, IRGACURE-OXE02, IRGACURE-OXE03, and IRGACURE-OXE04 (all manufactured by BASF), TRONLY TR-PBG-304, TRONLY TR-PBG-309, and TRONLY TR-PBG-305 (all manufactured by CHANGZHOU TRONLY NEW ELECTRONIC MATERIALS CO., LTD.), or ADEKA ARKLS NCI-930 and ADEKA OPTOMER N-1919 (a photopolymerization initiator 2 described in JP2012-014052A) (all manufactured by ADEKA Corporation) can also be preferably used.

An oxime compound having a fluorene ring can also be used as the photopolymerization initiator. Specific examples of the oxime compound having a fluorene ring include the compounds described in JP2014-137466A, the contents of which are incorporated herein by reference. Further, an oxime compound having a benzofuran skeleton can also be used as the photopolymerization initiator. Specific examples thereof include compounds OE-01 to OE-75 described in WO2015/036910A. Further, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compound (C-3) described in JP2013-164471A, and the contents of the publications are incorporated herein by reference. In addition, an oxime compound having a skeleton in which at least one benzene ring of a carbazole ring is a naphthalene ring as the photopolymerization initiator can also be used. Specific examples of such the oxime compound include the compounds described in WO2013/083505A. Further, an oxime compound having a nitro group can be used as the photopolymerization initiator. It is also preferable that the oxime compound having a nitro group is a dimer. Specific examples of the oxime compound having a nitro group include the compounds described in paragraph Nos. 0031 to 0047 of JP2013-114249A, the compounds described in paragraph Nos. 0008 to 0012 and 0070 to 0079 of JP2014-137466A, and the compounds described in paragraph Nos. 0007 to 0025 of JP4223071B, and ADEKA ARKLS NCI-831 (manufactured by ADEKA Corporation). Incidentally, a bifunctional, or trifunctional or higher photopolymerization initiator may be used as the photopolymerization initiator. Specific examples of such the photopolymerization initiator include the dimers of the oxime compounds described in JP2010-527339A, JP2011-524436A, WO2015/004565A, paragraph Nos. 0407 to 0412 of JP2016-532675A, and paragraph Nos. 0039 to 0055 of WO2017/033680A, the compound (E) and the compound (G) described in JP2013-522445A, and Cmpd 1 to 7 described in WO2016/034963A.

The content of the photopolymerization initiator is preferably 0.1% to 50% by mass, more preferably 0.5% to 30% by mass, and still more preferably 1% to 20% by mass, with respect to the total solid content of the coloring composition. The photopolymerization initiator may be used singly or in combination of two or more kinds thereof. In a case where two or more kinds of the photopolymerization initiators are used in combination, the total amount thereof is preferably within the range.

The coloring composition preferably contains a resin. Examples of the resin include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, a styrene resin, and a siloxane resin. The resin is blended in applications, such as an application for dispersing particles such as a pigment in the composition or an application as a binder. Incidentally, a resin which is usually used for dispersing particles such as a pigment is also referred to as a dispersant. However, such applications of the resin are only exemplary, and the resin can also be used for other purposes, in addition to the above-mentioned applications. The weight-average molecular weight (Mw) of the resin is preferably 5,000 to 100,000. Further, the number-average molecular weight (Mn) of the resin is preferably 1,000 to 20,000.

In the present invention, it is also preferable that a resin having an acid group is used as the resin. Examples of the acid group include a carboxyl group, a phosphoric acid group, a sulfo group, and a phenolic hydroxyl group, with the carboxyl group being preferable. The acid value of the resin having an acid group is preferably 25 to 200 mgKOH/g. The lower limit is more preferably 30 mgKOH/g or more, and still more preferably 40 mgKOH/g or more. The upper limit is more preferably 150 mgKOH/g or less, still more preferably 120 mgKOH/g or less, and particularly preferably 100 mgKOH/g or less.

In the present invention, it is also preferable that a resin having a group with an ethylenically unsaturated bond is used as the resin. It is also preferable that the resin having a group with an ethylenically unsaturated bond further has an acid group. As the resin having a group with an ethylenically unsaturated bond, the compound having a group with an ethylenically unsaturated bond described for the above-mentioned composition for forming an organic material layer can also be used.

In the present invention, the resin can also be used as a dispersant. Examples of the pigment dispersant include the dispersants described in paragraphs 0173 to 0179 of JP2015-151530A, the contents of which are incorporated herein by reference. Examples of a commercially available product of the dispersant include Disperbyk-161 (manufactured by BYK Chemie). In addition, the products described in paragraph No. 0129 of JP2012-137564A can also be used as the dispersant.

The content of the resin is preferably 1% to 80% by mass with respect to the total solid content of the coloring composition. The lower limit is more preferably 5% by mass or more, and still more preferably 10% by mass or more. The upper limit is more preferably 70% by mass or less, and still more preferably 60% by mass or less.

The coloring composition preferably contains a solvent. Examples of the solvent include the solvents described for the above-mentioned composition for forming an organic material layer.

Other additives such as a surfactant, an ultraviolet absorber, a polymerization inhibitor, an antioxidant, a filler, an adhesion promoter, and an aggregation inhibitor can be further blended into the coloring composition. Examples of these additives include the additives described in paragraph Nos. 0164 to 0300 of JP2016-102191A, the contents of which are incorporated herein by reference. Further, as the surfactant, the surfactants described for the above-mentioned composition for forming an organic material layer can also be used.

<Color Filter>

Next, the color filter of the embodiment of the present invention will be described. The color filter of the embodiment of the present invention has the above-mentioned structure of the embodiment of the present invention. The structure of the embodiment of the present invention itself may be used as a color filter, or the structure of the embodiment of the present invention, further having another functional layer such as a protective layer thereon may also be used as the color filter. The color filter of the embodiment of the present invention can be used for a solid-state imaging element such as a charge coupled device (CCD) and a complementary metal-oxide semiconductor (CMOS), an image display device, or the like.

<Solid-State Imaging Element>

The solid-state imaging element of an embodiment of the present invention has the above-mentioned structure of the embodiment of the present invention. The configuration of the solid-state imaging element of the embodiment of the present invention is not particularly limited as long as the solid-state imaging element is configured to comprise the structure of the embodiment of the present invention and function as a solid-state imaging element. However, examples thereof include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving portion of the photodiode, on the photodiodes and the transfer electrodes; have a device protecting film formed of silicon nitride or the like, which is formed to coat the entire surface of the light-shielding film and the light receiving portion of the photodiodes, on the light-shielding film; and have the structure of the embodiment of the present invention on the device protecting film. In addition, the solid-state imaging element may also be configured, for example, such that it has a light collecting means (for example, a microlens, which is the same hereinafter) on a device protecting film under the structure of the embodiment of the present invention (a side closer to the substrate), or has a light collecting means on the structure of the embodiment of the present invention. An imaging element comprising the solid-state imaging element of the embodiment of the present invention can also be used as an on-vehicle camera or a surveillance camera, in addition to a digital camera or electronic equipment (mobile phones or the like) having an imaging function.

<Image Display Device>

The structure of the embodiment of the present invention can be used for an image display device such as a liquid crystal display device and an organic electroluminescence display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinbelow, the present invention will be described in detail with reference to Examples. The materials, the amounts of materials used, the proportions, the treatment details, the treatment procedure, or the like shown in the Examples below may be modified if appropriate as long as the modifications do not depart from the spirit of the present invention. Therefore, the scope of the present invention should not be construed as being limited to the specific Examples shown below. In addition, "parts" and "%" are on a mass basis unless otherwise specified.

<Preparation of Composition for Forming Organic Material Layer>

Raw materials shown below were mixed to prepare each of compositions for forming an organic material layer.

(Composition 1 for Forming Organic Material Layer)
Resin 1 (54%-by-mass propylene glycol monomethyl ether (PGME) solution) . . . 0.7 parts by mass
Propylene glycol monomethyl ether acetate (PGMEA) . . . 99.3 parts by mass
(Composition 2 for Forming Organic Material Layer)
Resin 2 (40%-by-mass PGMEA solution) . . . 1.0 part by mass
PGMEA . . . 99.0 parts by mass
(Composition 3 for Forming Organic Material Layer)
Resin 3 . . . 0.4 parts by mass
PGMEA . . . 99.6 parts by mass
(Composition 4 for Forming Organic Material Layer)
Resin 1 (54%-by-mass PGME solution) . . . 0.7 parts by mass
Surfactant 1 (0.2%-by-mass PGMEA solution) . . . 0.8 parts by mass
PGMEA . . . 98.5 parts by mass
(Composition 5 for Forming Organic Material Layer)
Resin 1 (54%-by-mass PGME solution) . . . 1.2 parts by mass
Surfactant 1 (0.2%-by-mass PGMEA solution) . . . 0.8 parts by mass
PGMEA . . . 98.0 parts by mass
(Composition 6 for Forming Organic Material Layer)
Resin 2 (40%-by-mass PGMEA solution) . . . 1.0 part by mass
Surfactant 1 (0.2%-by-mass PGMEA solution) . . . 0.8 parts by mass
PGMEA . . . 98.2 parts by mass
(Composition 7 for Forming Organic Material Layer)
Resin 3 . . . 0.4 parts by mass
Surfactant 1 (0.2%-by-mass PGMEA solution) . . . 0.8 parts by mass
PGMEA . . . 98.8 parts by mass
(Composition 8 for Forming Organic Material Layer)
Curable compound 1 . . . 0.4 parts by mass
PGMEA . . . 99.6 parts by mass
(Composition 9 for Forming Organic Material Layer)
Curable compound 2 . . . 0.4 parts by mass
PGMEA . . . 99.6 parts by mass
(Composition 10 for Forming Organic Material Layer)
Curable compound 3 . . . 0.8 parts by mass
PGMEA . . . 99.2 parts by mass
(Composition 11 for Forming Organic Material Layer)
Resin 1 (54%-by-mass PGME solution) . . . 0.2 parts by mass
Curable compound 1 . . . 0.4 parts by mass
PGMEA . . . 99.4 parts by mass
(Composition 12 for Forming Organic Material Layer)
Resin 1 (54%-by-mass PGME solution) . . . 0.5 parts by mass
Curable compound 2 . . . 0.1 parts by mass
PGMEA . . . 99.4 parts by mass
(Composition 13 for Forming Organic Material Layer)
Resin 9 . . . 0.4 parts by mass Surfactant 1 (0.2%-by-mass PGMEA solution) . . . 0.8 parts by mass
PGMEA . . . 98.8 parts by mass
(Composition 14 for Forming Organic Material Layer)
Resin 10 . . . 0.4 parts by mass
Surfactant 1 (0.2%-by-mass PGMEA solution) . . . 0.8 parts by mass
PGMEA . . . 98.8 parts by mass
(Composition 15 for Forming Organic Material Layer)
Resin 11 . . . 0.4 parts by mass
Surfactant 1 (0.2%-by-mass PGMEA solution) . . . 0.8 parts by mass
PGMEA . . . 98.8 parts by mass
(Composition 16 for Forming Organic Material Layer)
Resin 12 . . . 0.4 parts by mass
Surfactant 1 (0.2%-by-mass PGMEA solution) . . . 0.8 parts by mass
PGMEA . . . 98.8 parts by mass
(Composition R1 for Forming Organic Material Layer)
Resin 4 . . . 0.4 parts by mass
PGMEA . . . 99.6 parts by mass
(Composition R2 for Forming Organic Material Layer)
Resin 4 . . . 0.2 parts by mass
PGMEA . . . 99.8 parts by mass
(Composition R3 for Forming Organic Material Layer)
Resin 5 . . . 0.5 parts by mass
PGMEA . . . 99.5 parts by mass
(Composition R4 for Forming Organic Material Layer)
Resin 6 . . . 0.8 parts by mass
PGMEA . . . 99.2 parts by mass
(Composition R5 for Forming Organic Material Layer)
Resin 4 . . . 0.3 parts by mass
Surfactant 1 (0.2%-by-mass PGMEA solution) . . . 0.8 parts by mass
PGMEA . . . 98.9 parts by mass
(Composition R6 for Forming Organic Material Layer)
Resin 7 (40%-by-mass PGMEA solution) . . . 1.0 part by mass
Surfactant 1 (0.2%-by-mass PGMEA solution) . . . 0.8 parts by mass
PGMEA . . . 98.2 parts by mass
(Composition R7 for Forming Organic Material Layer)
Resin 8 (40%-by-mass PGMEA solution) . . . 0.8 parts by mass
PGMEA . . . 99.2 parts by mass The raw materials used for the compositions 1 to 12 and R1 to R7 for forming an organic material layer are as follows. Further, the resin 4, the resin 5, and the resin 6 are resins that do not include a group with an ethylenically unsaturated bond.

Resin 1: Cyclomer P (ACA) 230AA (manufactured by Daicel Chemical Industry Ltd., acid value=30 mgKOH/g, Mw=15,000)

Resin 2: Resin having the following structure (acid value=70 mgKOH/g, Mw=11,000, and the numerical values appended to the main chains are molar ratios)

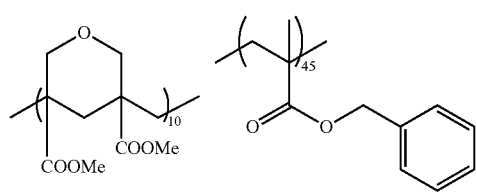

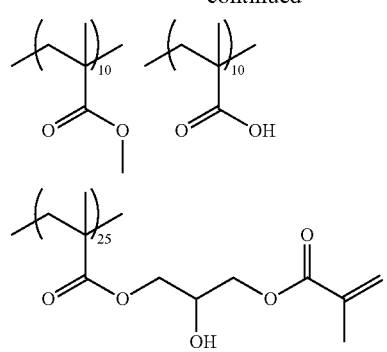

Resin 3: Resin having the following structure (acid value=95 mgKOH/g, Mw=18,000, and the numerical values appended to the main chains are molar ratios)

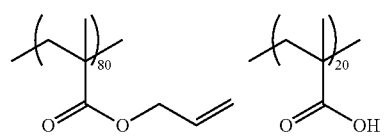

Resin 4: JER154 (manufactured by Mitsubishi Chemical Corporation, epoxy resin)

Resin 5: JER807 (manufactured by Mitsubishi Chemical Corporation, epoxy resin)

Resin 6: EPICLON N-690 (manufactured by DIC Corporation, epoxy resin)

Resin 7: The following structure (acid value=80 mgKOH/g, Mw=12,000, and the numerical values appended to the main chains are mass ratios)

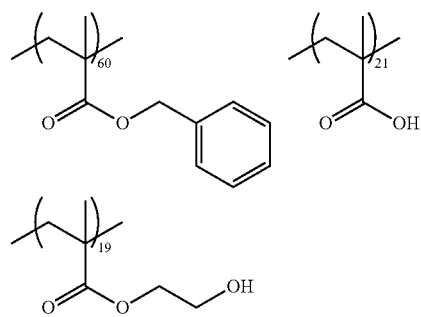

Resin 8: The following structure (acid value=70 mgKOH/g, Mw=10,000, and the numerical values appended to the main chains are molar ratios)

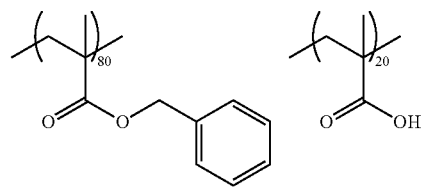

Resin 9: The following structure (acid value=121 mgKOH/g, Mw=18,000, and the

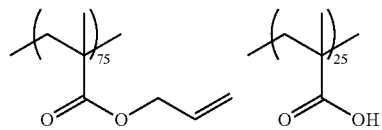

Resin 10: Resin having the following structure (acid value=0 mgKOH/g, Mw=18,000)

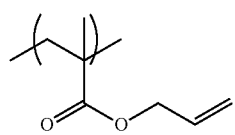

Resin 11: Resin having the following structure (acid value=95 mgKOH/g, Mw=22,000, and the numerical values appended to the main chains are molar ratios)

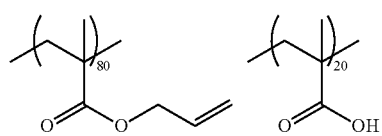

Resin 12: Resin having the following structure (acid value=95 mgKOH/g, Mw=4,000, and the numerical values appended to the main chains are molar ratios)

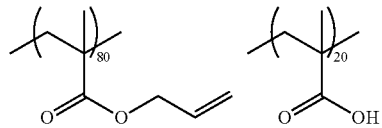

Surfactant 1: The following mixture (Mw=14,000, and % representing the proportion of the repeating units is % by mass.)

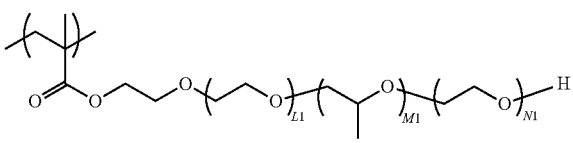

62%

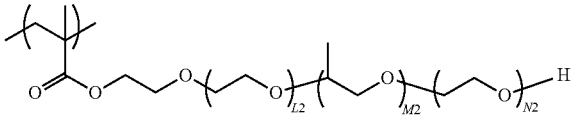

38%

L1 + N1 + L2 + N2 = 14
M1 + M2 = 17

Curable compound 1: Compound having the following structure

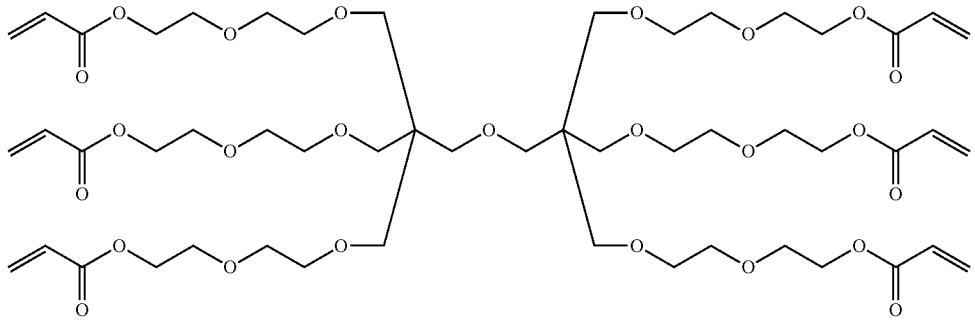 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Curable compound 2: Mixture of compounds having the following structures (Mixture of the left compound and the right compound at a molar ratio of 7:3)

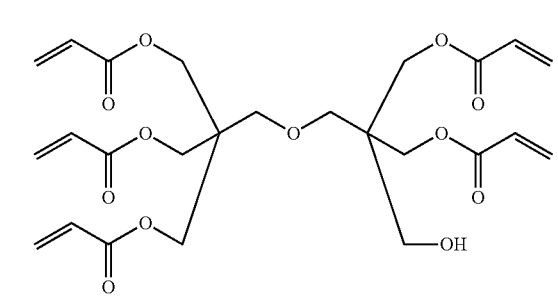

-continued

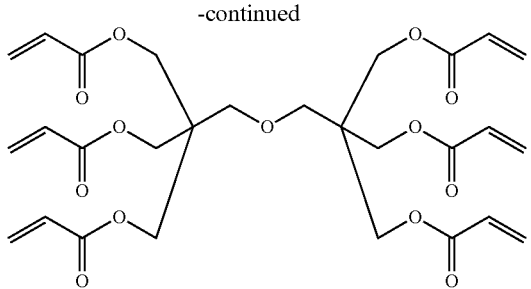

Curable compound 3: M-305 (Triacrylate: 55% to 63% by mass, manufactured by Toagosei Co., Ltd.)

<Preparation of Coloring Composition>

(Red Composition 1)

Raw materials shown below were mixed, stirred, and then filtered through a nylon-made filter having a pore diameter of 0.45 μm (manufactured by Nihon Pall Corporation) to prepare Red composition 1.

Red pigment dispersion liquid . . . 51.7 parts by mass
Resin 2 (40%-by-mass PGMEA solution) . . . 0.6 parts by mass
Curable compound 1 . . . 0.6 parts by mass
Photopolymerization initiator 1 . . . 0.3 parts by mass
Surfactant 1 . . . 4.2 parts by mass
PGMEA . . . 42.6 parts by mass (Red Composition 2)

Raw materials shown below were mixed, stirred, and then filtered through a nylon-made filter having a pore diameter of 0.45 μm (manufactured by Nihon Pall Corporation) to prepare Red composition 2.

Red pigment dispersion liquid . . . 51.7 parts by mass
Resin 3 . . . 0.6 parts by mass
Curable compound 2 . . . 0.6 parts by mass
Photopolymerization initiator 1 . . . 0.3 parts by mass
Surfactant 1 . . . 4.2 parts by mass
PGMEA . . . 42.6 parts by mass (Green Composition 1)

Raw materials shown below were mixed, stirred, and then filtered through a nylon-made filter having a pore diameter of 0.45 μm (manufactured by Nihon Pall Corporation) to prepare Green composition 1.

Green pigment dispersion liquid . . . 73.7 parts by mass
Resin 2 (40%-by-mass PGMEA solution) . . . 0.3 parts by mass
Curable compound 2 . . . 1.2 parts by mass
Photopolymerization initiator 1 . . . 0.6 parts by mass
Surfactant 1 . . . 4.2 parts by mass
Ultraviolet absorber 1 . . . 0.5 parts by mass
PGMEA . . . 19.5 parts by mass (Green Composition 2)

Raw materials shown below were mixed, stirred, and then filtered through a nylon-made filter having a pore diameter of 0.45 μm (manufactured by Nihon Pall Corporation) to prepare Green composition 2.

Green pigment dispersion liquid . . . 73.7 parts by mass
Resin 1 (54%-by-mass PGME solution) . . . 0.3 parts by mass
Curable compound 2 . . . 1.2 parts by mass
Photopolymerization initiator 3 . . . 0.6 parts by mass
Surfactant 1 . . . 4.2 parts by mass
Ultraviolet absorber 1 . . . 0.5 parts by mass
PGMEA . . . 19.5 parts by mass (Blue Composition 1)

Raw materials shown below were mixed, stirred, and then filtered through a nylon-made filter having a pore diameter of 0.45 μm (manufactured by Nihon Pall Corporation) to prepare Blue composition 1.

Blue pigment dispersion liquid . . . 44.9 parts by mass
Resin 2 (40%-by-mass PGMEA solution) . . . 2.1 parts by mass
Curable compound 1 . . . 1.5 parts by mass
Curable compound 3 . . . 0.7 parts by mass
Photopolymerization initiator 2 . . . 0.8 parts by mass
Surfactant 1 . . . 4.2 parts by mass
PGMEA . . . 45.8 parts by mass (Blue Composition 2)

Raw materials shown below were mixed, stirred, and then filtered through a nylon-made filter having a pore diameter of 0.45 μm (manufactured by Nihon Pall Corporation) to prepare Blue composition 2.

Blue pigment dispersion liquid . . . 44.9 parts by mass
Resin 1 (54%-by-mass PGME solution) . . . 2.1 parts by mass
Curable compound 1 . . . 1.5 parts by mass
Curable compound 2 . . . 0.7 parts by mass
Photopolymerization initiator 1 . . . 0.8 parts by mass
Surfactant 1 . . . 4.2 parts by mass
PGMEA . . . 45.8 parts by mass The raw materials used for Red compositions 1 and 2, Green compositions 1 and 2, and Blue compositions 1 and 2 are as follows.

Resins 1 to 3: Resins 1 to 3 described for the composition for forming an organic material layer Curable compounds 1 to 3: Curable compounds 1 to 3 described for the composition for forming an organic material layer Surfactant 1: Surfactant 1 described for the composition for forming an organic material layer Photopolymerization initiator 1: IRGACURE-OXE01 (manufactured by BASF)

Photopolymerization initiator 2: Compound having the following structure

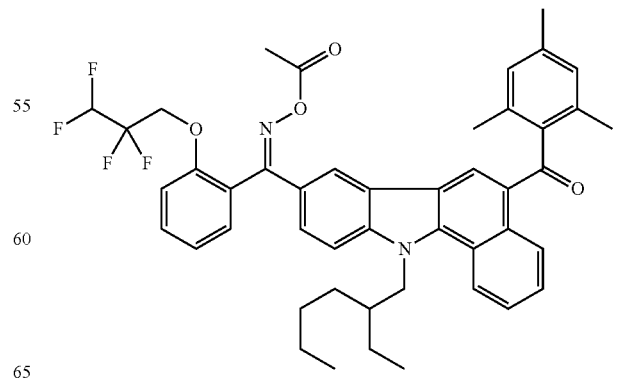

Photopolymerization initiator 3: Compound having the following structure

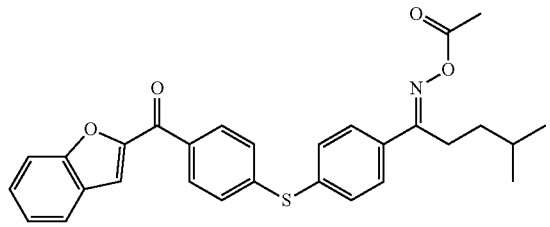 [SMILES: CC(=O)O/N=C(\CCC(C)C)c1ccc(Sc2ccc(C(=O)c3cc4ccccc4o3)cc2)cc1]

Ultraviolet absorber 1: Compound having the following structure

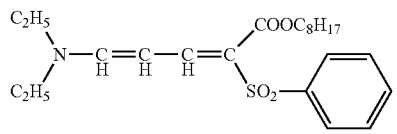

Red Pigment Dispersion Liquid

A mixed solution formed of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed for 3 hours using a beads mill (zirconia beads with a diameter of 0.3 mm) to prepare a pigment dispersion liquid. Thereafter, a dispersion treatment was performed at a flow rate of 500 g/min under a pressure of 2,000 kg/cm$^3$ using a high pressure dispersion apparatus having a reduced pressure control NANO-3000-10 (manufactured by Japan BEE Co., Ltd.). This dispersion treatment was repeated 10 times to obtain a Red pigment dispersion liquid.

Green Pigment Dispersion Liquid

A mixed solution formed of 6.4 parts by mass of C. I. Pigment Green 36, 5.3 parts by mass of C. I. Pigment Yellow 150, 5.2 parts by mass of a dispersant (Disperbyk-161, manufactured by BYK Chemie), and 83.1 parts by mass of PGMEA was mixed and dispersed for 3 hours using a beads mill (zirconia beads with a diameter of 0.3 mm) to prepare a pigment dispersion liquid. Thereafter, a dispersion treatment was performed at a flow rate of 500 g/min under a pressure of 2,000 kg/cm$^3$ using a high pressure dispersion apparatus having a reduced pressure control NANO-3000-10 (manufactured by Japan BEE Co., Ltd.). This dispersion treatment was repeated 10 times to obtain a Green pigment dispersion liquid.

Blue Pigment Dispersion Liquid

A mixed solution formed of 9.7 parts by mass of C. I. Pigment Blue 15:6, 2.4 parts by mass of C. I. Pigment Violet 23, 5.5 parts by mass of a dispersant (Disperbyk-161, manufactured by BYK Chemie), and 82.4 parts by mass of PGMEA was mixed and dispersed for 3 hours using a beads mill (zirconia beads with a diameter of 0.3 mm) to prepare a pigment dispersion liquid. Thereafter, a dispersion treatment was performed at a flow rate of 500 g/min under a pressure of 2,000 kg/cm$^3$ using a high pressure dispersion apparatus having a reduced pressure control NANO-3000-10 (manufactured by Japan BEE Co., Ltd.). This dispersion treatment was repeated 10 times to obtain a Blue pigment dispersion liquid.

<Production of Structure and Solid-State Imaging Element>

Examples 1 to 20 and Comparative Examples 3 to 13

A silicon oxide layer was formed on a silicon wafer by a plasma CVD method. Then, this silicon oxide layer was patterned by a dry etching method to form partition walls (a width of 100 nm and a thickness of 500 nm) formed of silicon oxide in a lattice shape at intervals of 1.0 µm. The dimension of the openings (the regions partitioned by the partition walls on the silicon wafer) of the partition walls on the silicon wafer was 1.0 µm in vertical length and 1.0 µm in horizontal length.

Next, each of compositions for forming an organic material layer was applied onto the silicon wafer having the partition walls formed thereon by a spin coating method, subsequently heated at 100° C. for 2 minutes using a hot plate, and then heated at 230° C. for 2 minutes using a hot plate to form organic material layers having a film thickness of 15 nm.

Subsequently, Green composition was applied onto the silicon wafer having the organic material layers formed thereon by a spin coating method such that the film thickness after forming the film reached 0.5 µm, and subsequently heated at 100° C. for 2 minutes using a hot plate. Exposure was performed at an exposure dose of 150 mJ/cm$^2$ through a mask having a Bayer pattern of 0.9 µm, using an i-ray stepper exposure device "FPA-3000i5+" (manufactured by Canon Inc.). Then, puddle development was performed at 23° C. for 60 seconds using a 0.3%-by-mass aqueous tetramethylammonium hydroxide (TMAH) solution. Thereafter, rinsing was performed by spin shower, further washing with pure water was performed, and then heating was performed at 220° C. for 5 minutes using a hot plate to form green colored layers in the regions partitioned by the partition walls.

Next, Red composition and Blue composition were also sequentially patterned to form each of colored layers in red and colored layers in blue on the regions partitioned by the partition walls.

A structure produced in this manner was introduced to a solid-state imaging element by the known method.

Comparative Example 1

A structure was formed in the same manner as in Example 1 except that an organic material layer was not formed in Example 1, and the obtained structure was introduced to a solid-state imaging element by the known method.

Comparative Example 2

Partition walls were formed on a silicon wafer in the same manner as in Example 1. The silicon wafer having partition walls formed thereon was subjected to a vapor treatment with 1,1,1,3,3,3-hexamethyldisilazane (HMDS) at 110° C. for 60 seconds, thereby forming HMDS layers. Colored layers in green, red, and blue were formed in the regions partitioned by the partition walls in the same manner as in Example 1, on the HMDS layers, thereby producing a structure. The structure produced in this manner was introduced to a solid-state imaging element by the known method.

(Evaluation of Moisture Resistance)

Each of the solid-state imaging elements was tested at a constant temperature and a constant humidity for 2,000 hours under the conditions of 130° C. and a relative humidity of 85%. The structure was taken out from the solid-state imaging element after the test at a constant temperature and a constant humidity, the cross section of the structure was observed using a transmission electron microscope, and the presence or absence of voids between the partition walls and the colored layers was observed, thereby determining the moisture resistance. In a case where gaps were found between the partition walls and the colored layers, it was determined that voids were generated. The results are shown in the following table.

Evaluation Standard

5: Ten positions were observed, and thus, voids were not observed in any of the positions.

4: Ten positions were observed, and thus, voids were observed in one of the positions.

3: Ten positions were observed, and thus, voids were observed in two or three of the positions.

2: Ten positions were observed, and thus, voids were observed in four to six of the positions.

1: Ten positions were observed, and thus, voids were observed in seven to nine of the positions.

0: Ten positions were observed, and thus, voids were observed in all of the ten positions.

TABLE 1

| | Composition used | | | | Performance evaluation |
|---|---|---|---|---|---|
| | Composition for forming organic material layer | Green composition | Red composition | Blue composition | Moisture resistance |
| Example 1 | Composition 1 for forming organic material layer | Green composition 1 | Red composition 1 | Blue composition 1 | 4 |
| Example 2 | Composition 2 for forming organic material layer | Green composition 1 | Red composition 1 | Blue composition 1 | 4 |
| Example 3 | Composition 3 for forming organic material layer | Green composition 1 | Red composition 1 | Blue composition 1 | 4 |
| Example 4 | Composition 4 for forming organic material layer | Green composition 1 | Red composition 1 | Blue composition 1 | 5 |
| Example 5 | Composition 5 for forming organic material layer | Green composition 1 | Red composition 1 | Blue composition 1 | 5 |
| Example 6 | Composition 6 for forming organic material layer | Green composition 1 | Red composition 1 | Blue composition 1 | 5 |
| Example 7 | Composition 7 for forming organic material layer | Green composition 1 | Red composition 1 | Blue composition 1 | 5 |
| Example 8 | Composition 8 for forming organic material layer | Green composition 1 | Red composition 1 | Blue composition 1 | 3 |
| Example 9 | Composition 9 for forming organic material layer | Green composition 1 | Red composition 1 | Blue composition 1 | 3 |
| Example 10 | Composition 10 for forming organic material layer | Green composition 1 | Red composition 1 | Blue composition 1 | 3 |
| Example 11 | Composition 11 for forming organic material layer | Green composition 1 | Red composition 1 | Blue composition 1 | 3 |
| Example 12 | Composition 12 for forming organic material layer | Green composition 1 | Red composition 1 | Blue composition 1 | 3 |
| Example 13 | Composition 2 for forming organic material layer | Green composition 2 | Red composition 1 | Blue composition 1 | 4 |
| Example 14 | Composition 3 for forming an organic material layer | Green composition 1 | Red composition 2 | Blue composition 1 | 4 |
| Example 15 | Composition 4 for forming organic material layer | Green composition 1 | Red composition 1 | Blue composition 2 | 5 |
| Example 16 | Composition 11 for forming organic material layer | Green composition 2 | Red composition 2 | Blue composition 2 | 3 |
| Example 17 | Composition 13 for forming organic material layer | Green composition 1 | Red composition 1 | Blue composition 1 | 4 |
| Example 18 | Composition 14 for forming organic material layer | Green composition 1 | Red composition 1 | Blue composition 1 | 4 |
| Example 19 | Composition 15 for forming organic material layer | Green composition 1 | Red composition 1 | Blue composition 1 | 4 |
| Example 20 | Composition 16 for forming organic material layer | Green composition 1 | Red composition 1 | Blue composition 1 | 4 |
| Comparative Example 1 | None | Green composition 1 | Red composition 1 | Blue composition 1 | 0 |
| Comparative Example 2 | HMDS treatment | Green composition 1 | Red composition 1 | Blue composition 1 | 0 |
| Comparative Example 3 | Composition R1 for forming organic material layer | Green composition 1 | Red composition 1 | Blue composition 1 | 0 |
| Comparative Example 4 | Composition R2 for forming organic material layer | Green composition 1 | Red composition 1 | Blue composition 1 | 0 |
| Comparative Example 5 | Composition R3 for forming organic material layer | Green composition 1 | Red composition 1 | Blue composition 1 | 0 |
| Comparative Example 6 | Composition R4 for forming organic material layer | Green composition 1 | Red composition 1 | Blue composition 1 | 0 |
| Comparative Example 7 | Composition R5 for forming organic material layer | Green composition 1 | Red composition 1 | Blue composition 1 | 0 |
| Comparative Example 8 | Composition R6 for forming organic material layer | Green composition 1 | Red composition 1 | Blue composition 1 | 0 |

TABLE 1-continued

| | Composition used | | | | Performance evaluation Moisture resistance |
|---|---|---|---|---|---|
| | Composition for forming organic material layer | Green composition | Red composition | Blue composition | |
| Comparative Example 9 | Composition R7 for forming organic material layer | Green composition 1 | Red composition 1 | Blue composition 1 | 0 |
| Comparative Example 10 | Composition R2 for forming organic material layer | Green composition 2 | Red composition 1 | Blue composition 1 | 0 |
| Comparative Example 11 | Composition R3 for forming organic material layer | Green composition 1 | Red composition 2 | Blue composition 1 | 0 |
| Comparative Example 12 | Composition R4 for forming organic material layer | Green composition 1 | Red composition 1 | Blue composition 2 | 0 |
| Comparative Example 13 | Composition R5 for forming organic material layer | Green composition 2 | Red composition 2 | Blue composition 2 | 0 |

As shown in the table, the structures of Examples had excellent moisture resistance.

Furthermore, in each of Examples, the same effects were obtained even in a case where the partition walls were formed of an organic material such as an acrylic resin, a polystyrene-based resin, a polyimide-based resin, and an organic SOG-based resin, or an inorganic material such as porous silica, polycrystalline silicon, silicon nitride, tungsten, and aluminum.

Example 101

A fluorine resin (CYTOP, manufactured by Asahi Glass Co., Ltd.) was applied onto a silicon wafer and then heated at 220° C. for 5 minutes to form a partition wall material layer. The partition wall material layer was patterned by a dry etching method under the conditions described in paragraph Nos. 0128 to 0133 of JP2016-014856A to form partition walls (a width of 100 nm and a thickness of 500 nm) in a lattice shape at intervals of 1.0 am. The dimension of the openings (regions partitioned by the partition walls on the silicon wafer) of the partition walls on the silicon wafer was 1.0 μm in vertical length and 1.0 μm in horizontal length.

Next, a composition 6 for forming an organic material layer was applied onto the silicon wafer having the partition walls formed thereon by a spin coating method, subsequently heated at 100° C. for 2 minutes using a hot plate, and then heated at 230° C. for 2 minutes using a hot plate to form organic material layers having a film thickness of 15 nm.

Subsequently, Green composition 1 was applied onto the silicon wafer having the organic material layers formed thereon by a spin coating method such that the film thickness after forming the film reached 0.5 μm, and subsequently heated at 100° C. for 2 minutes using a hot plate. Exposure was performed at an exposure dose of 150 mJ/cm$^2$ through a mask having a Bayer pattern of 0.9 μm, using an i-ray stepper exposure device "FPA-3000i5+" (manufactured by Canon Inc.). Then, puddle development was performed at 23° C. for 60 seconds using a 0.3%-by-mass aqueous tetramethylammonium hydroxide (TMAH) solution. Thereafter, rinsing was performed by spin shower, further washing with pure water was performed, and then heating was performed at 220° C. for 5 minutes using a hot plate to form green colored layers in the regions partitioned by the partition walls.

Next, Red composition 1 and Blue composition 1 were also sequentially patterned to form each of colored layers in red and colored layers in blue on the regions partitioned by the partition walls.

A structure produced in this manner was introduced to a solid-state imaging element by the known method.

This structure had excellent moisture resistance.

Example 102

In the same manner as in Example 101, except that the composition 107 described in paragraph No. 0160 of JP2015-166449A was applied onto a silicon wafer and then heated at 220° C. for 5 minutes to form a partition wall material layer in Example 101, a structure was produced, and introduced into a solid-state imaging element by a known method. This structure had excellent moisture resistance.

Example 103

In the same manner as in Example 101, except that a composition including 10% by mass of a cage type siloxane resin (a weight-average molecular weight of 200,000 and a dispersity of 3.0) having the following structure and 90% by mass of PGMEA was applied onto a silicon wafer, and then heated at 220° C. for 5 minutes to form a partition wall material layer in Example 101, a structure was produced, and introduced into a solid-state imaging element by a known method. This structure had excellent moisture resistance.

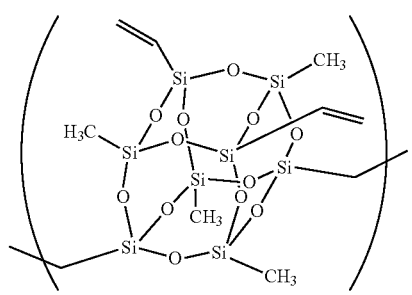

Example 104

In the same manner as in Example 101, except that a composition for forming a partition wall material layer, including 10 parts by mass of the following colloidal silica particle solution P1, 0.02 parts by mass of the above-mentioned surfactant 1, 7 parts by mass of polyethylene glycol monomethyl ether, 35 parts by mass of ethyl lactate, 43 parts by mass of PGME, 4 parts by mass of a mixture of ethanol and methanol, and 1 part by mass of water, was applied onto a silicon wafer, and then heated at 220° C. for 5 minutes to form a partition wall material layer, a structure was produced, and introduced into a solid-state imaging element by a known method. This structure had excellent moisture resistance.

Method for Preparing Colloidal Silica Particle Solution P1

Tetraethoxysilane (TEOS) was prepared as a silicon alkoxide (A), and trifluoropropyl trimethoxysilane (TFPTMS) was prepared as a fluoroalkyl group-containing silicon alkoxide (B). They were weighed such that a proportion (mass ratio) of the fluoroalkyl group containing silicon alkoxide (B) in a case where the mass of the silicon alkoxide (A) was taken as 1 reached 0.6, and these were put into a separable flask and mixed to obtain a mixture. Propylene glycol monomethyl ether (PGME) in the amount of 1.0 part by mass with respect to 1.0 part by mass of the mixture was added thereto, and the resulting mixture was stirred at a temperature of 30° C. for 15 minutes to prepare a first solution.

Furthermore, in addition to the first solution, ion exchange water in the amount of 1.0 part by mass and formic acid in the amount of 0.01 parts by mass with respect to 1.0 part by mass of the mixture were added thereto, and the resulting mixture was stirred at a temperature of 30° C. for 15 minutes to prepare a second solution.

Next, the prepared first solution was held at a temperature of 55° C. in a water bath, then the second solution was added to the first solution, and the mixture was stirred for 60 minutes while the temperature was held. Thus, a solution F including a hydrolyzate of the silicon alkoxide (A) and the fluoroalkyl group-containing silicon alkoxide (B) was obtained. The concentration of the solid content of the solution F was 10% by mass in terms of $SiO_2$.

Subsequently, a mixed solution obtained by adding 0.1 parts by mass of an aqueous calcium nitrate solution at a concentration of 30% by mass to 100 parts by mass of an aqueous dispersion liquid including 30% by mass of commercially available colloidal silica (manufactured by Nissan Chemical Industries, Ltd., trade name ST-30) having an average diameter of 15 nm was heated at 120° C. for 5 hours in a stainless steel-made autoclave.

For this mixed solution, the solvent was replaced by propylene glycol monomethyl ether using an ultrafiltration method, and the solution was further stirred for 30 minutes at a rotation speed of 14,000 rpm using a Homomixer (manufactured by PRIMIX Corporation), and sufficiently dispersed. Propylene glycol monomethyl ether was added thereto to obtain a colloidal silica particle solution G having a concentration of the solid content 15% by mass.

30 parts by mass of the solution F and 70 parts by mass of the colloidal silica particle solution G were mixed, and the mixture was further heated at 40° C. for 10 hours and subjected to centrifugation at 1,000 G for 10 minutes to remove sediments, thereby obtaining a colloidal silica particle solution P1. For of the spherical silica included in the colloidal silica particle solution P1, the average particle diameter $D_0$ was 15 nm, the average particle diameter $D_1$ was 80 nm, and the average particle diameter $D_2$ was 15 nm. Further, the average particle diameter $D_0$ is an average particle diameter of the circle-equivalent diameter in the projected image of the spherical portion of the spherical silica as measured with a transmission electron microscope (TEM). Incidentally, the average particle diameter $D_1$ is an average particle diameter of the colloidal silica particles as measured by a dynamic light scattering method. In addition, the average particle diameter $D_2$ is an average particle diameter of the colloidal silica particles as determined from a specific surface area.

Example 105

In the same manner as in Example 101, except that a composition for forming a partition wall material layer, including 10 parts by mass of the colloidal silica particle solution P1, 0.02 parts by mass of a surfactant (MEGAFACE F559 (manufactured by DIC Corporation)), 9 parts by mass of 3-butoxy-N,N-dimethylpropanamide, 30 parts by mass of ethyl lactate, 46 parts by mass of PGME, 4 parts by mass of a mixture of ethanol and methanol, and 1 part by mass of water, was applied onto a silicon wafer, and then heated at 220° C. for 5 minutes to form a partition wall material layer, a structure was produced, and introduced into a solid-state imaging element by a known method. This structure had excellent moisture resistance.

Explanation of References

1: support
2: partition wall
3: organic material layer
4: colored layer
100: structure

What is claimed is:
1. A structure comprising:
a support;
partition walls formed on the support;
colored layers formed in regions partitioned by the partition walls, on the support; and
organic material layers formed using a composition including a surfactant and a compound having a group with an ethylenically unsaturated bond, between the partition walls and the colored layers,
wherein the partition walls include colloidal silica particles.
2. The structure according to claim 1,
wherein the thickness of the organic material layers is 30 nm or less.
3. The structure according to claim 1,
wherein the compound having a group with an ethylenically unsaturated bond includes a resin having a group with an ethylenically unsaturated bond in a side chain thereof.
4. The structure according to claim 3,
wherein the acid value of the resin is 10 to 100 mgKOH/g.
5. The structure according to claim 3,
wherein the weight-average molecular weight of the resin is 5,000 to 20,000.
6. The structure according to claim 1,
wherein the colored layers are formed using a composition including a compound having a group with an ethylenically unsaturated bond.
7. A color filter comprising the structure according to claim 1.
8. A solid-state imaging element comprising the structure according to claim 1.
9. An image display device comprising the structure according to claim 1.
10. A method for producing a structure, comprising:
forming partition walls on a support;
forming organic material layers using a composition for forming an organic material layer, including a surfac- tant and a compound having a group with an ethylenically unsaturated bond, on the surface of the partition walls; and forming colored layers in regions partitioned by the partition walls having the organic material layers formed on the surface thereof, on the support, wherein the partition walls include colloidal silica particles.

11. The method for producing a structure according to claim 10, wherein the compound having a group with an ethylenically unsaturated bond includes a resin having a group with an ethylenically unsaturated bond in a side chain thereof.

12. The method for producing a structure according to claim 10, wherein the composition for forming an organic material layer contains 99% to 99.99% by mass of a solvent.

13. The method for producing a structure according to claim 10, wherein the colored layers are formed using a coloring composition including a compound having a group with an ethylenically unsaturated bond.

14. A composition for forming an organic material layer of a structure including a support, partition walls formed on the support, colored layers formed in regions partitioned by the partition walls, on the support, and the organic material layers formed between the partition walls and the colored layers, the composition comprising a compound having a group with an ethylenically unsaturated bond.

15. The composition for forming an organic material layer according to claim 14, wherein the compound having a group with an ethylenically unsaturated bond includes a resin having a group with an ethylenically unsaturated bond in a side chain thereof.

16. The composition for forming an organic material layer according to claim 14, further comprising a surfactant.

17. The composition for forming an organic material layer according to claim 14, further comprising 99% to 99.99% by mass of a solvent.

18. A structure comprising:

a support;

partition walls formed on the support;

colored layers formed in regions partitioned by the partition walls, on the support; and organic material layers formed using a composition including a surfactant and a compound having a group with an ethylenically unsaturated bond, between the partition walls and the colored layers, wherein the compound having a group with an ethylenically unsaturated bond is at least one selected from the group consisting of a trifunctional to pentadecafunctional (meth)acrylate compound and a polymer including a repeating unit having a group with an ethylenically unsaturated bond in a side chain.

19. The structure according to claim 1, wherein the compound having a group with an ethylenically unsaturated bond contains a resin having a group with an ethylenically unsaturated bond.

20. The structure according to claim 1, wherein the content of the compound having the group with an ethylenically unsaturated bond is 0.01 to 1% by mass with respect to the total mass of the composition.

21. The structure according to claim 1, wherein the content of the compound having the a group with an ethylenically unsaturated bond in the total solids content of the composition is 50% to 100% by mass.

* * * * *